US010056267B2

(12) United States Patent
Cheng et al.

(10) Patent No.: US 10,056,267 B2
(45) Date of Patent: Aug. 21, 2018

(54) SUBSTRATE DESIGN FOR SEMICONDUCTOR PACKAGES AND METHOD OF FORMING SAME

(71) Applicant: Taiwan Semiconductor Manufacturing Company, Ltd., Hsin-Chu (TW)

(72) Inventors: Jung Wei Cheng, Hsin-Chu (TW); Tsung-Ding Wang, Tainan (TW); Mirng-Ji Lii, Sinpu Township (TW); Chien-Hsun Lee, Chu-tung Town (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 14/181,305

(22) Filed: Feb. 14, 2014

(65) Prior Publication Data
US 2015/0235990 A1    Aug. 20, 2015

(51) Int. Cl.
*H01L 21/48* (2006.01)
*H01L 23/00* (2006.01)
(Continued)

(52) U.S. Cl.
CPC .......... *H01L 21/4846* (2013.01); *H01L 23/13* (2013.01); *H01L 23/36* (2013.01);
(Continued)

(58) Field of Classification Search
CPC . H01L 21/561; H01L 23/055; H01L 23/5389; H01L 24/17; H01L 24/97; H01L 25/0657
See application file for complete search history.

(56) References Cited

U.S. PATENT DOCUMENTS 4,728,751 A    3/1988 Canestaro et al.
4,811,082 A    3/1989 Jacobs et al.
(Continued)

FOREIGN PATENT DOCUMENTS

CN    202394961 U    8/2012
CN    202523706 U    11/2012
(Continued)

OTHER PUBLICATIONS

Ranganathan, N., et al., •Integration of High Aspect Ratio Tapered Silicon Via for Through-Silicon Interconnection,• 58th Electronic Components and Technology Conference, ECTC 2008., May 2008, pp. 859-865, IEEE, Lake Buena Vista, Florida, United States.
(Continued)

*Primary Examiner* — Mohsen Ahmadi
(74) *Attorney, Agent, or Firm* — Slater Matsil, LLP

(57) ABSTRACT

An embodiment device includes a first die, a second die, one or more redistribution layers (RDLs) electrically connected to the first die, a plurality of connectors on a surface of the one or more RDLs and a package substrate electrically connected to the first die and the second die. The package substrate is electrically connected to the first die through the one or more RDLs and the plurality of connectors. The package substrate comprises a cavity, and the second die is at least partially disposed in the cavity.

20 Claims, 19 Drawing Sheets

(51) Int. Cl.

| | |
|---|---|
| *H01L 23/498* | (2006.01) |
| *H01L 23/36* | (2006.01) |
| *H01L 25/00* | (2006.01) |
| *H01L 23/367* | (2006.01) |
| *H01L 23/13* | (2006.01) |
| *H01L 23/538* | (2006.01) |
| *H01L 25/03* | (2006.01) |
| *H01L 25/10* | (2006.01) |
| *H01L 25/065* | (2006.01) |

(52) U.S. Cl.
CPC .... *H01L 23/3675* (2013.01); *H01L 23/49816* (2013.01); *H01L 23/49894* (2013.01); *H01L 23/5385* (2013.01); *H01L 23/5389* (2013.01); *H01L 24/14* (2013.01); *H01L 24/19* (2013.01); *H01L 24/20* (2013.01); *H01L 24/96* (2013.01); *H01L 24/97* (2013.01); *H01L 25/03* (2013.01); *H01L 25/105* (2013.01); *H01L 25/50* (2013.01); *H01L 25/0657* (2013.01); *H01L 2224/0401* (2013.01); *H01L 2224/04105* (2013.01); *H01L 2224/12105* (2013.01); *H01L 2224/131* (2013.01); *H01L 2224/13025* (2013.01); *H01L 2224/13082* (2013.01); *H01L 2224/1403* (2013.01); *H01L 2224/16227* (2013.01); *H01L 2224/16235* (2013.01); *H01L 2224/16238* (2013.01); *H01L 2224/32225* (2013.01); *H01L 2224/32245* (2013.01); *H01L 2224/73204* (2013.01); *H01L 2224/73253* (2013.01); *H01L 2224/73267* (2013.01); *H01L 2224/81005* (2013.01); *H01L 2224/81192* (2013.01); *H01L 2224/81815* (2013.01); *H01L 2224/83005* (2013.01); *H01L 2224/9222* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2225/1023* (2013.01); *H01L 2225/1058* (2013.01); *H01L 2924/12042* (2013.01); *H01L 2924/15151* (2013.01); *H01L 2924/15153* (2013.01); *H01L 2924/15159* (2013.01); *H01L 2924/15192* (2013.01); *H01L 2924/15311* (2013.01); *H01L 2924/15321* (2013.01); *H01L 2924/16235* (2013.01); *H01L 2924/16251* (2013.01); *H01L 2924/181* (2013.01); *H01L 2924/18161* (2013.01); *H01L 2924/18162* (2013.01)

(56) References Cited

U.S. PATENT DOCUMENTS

| | | | |
|---|---|---|---|
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 12/1996 | Hsu | |
| 5,818,404 A | 10/1998 | Lebby et al. | |
| 5,895,978 A | 4/1999 | Patagonia | |
| 6,002,177 A | 12/1999 | Gaynes et al. | |
| 6,025,648 A | 2/2000 | Takahashi et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,271,469 B1 | 8/2001 | Ma et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,603,072 B1 * | 8/2003 | Foster | H01L 25/0657 |
| | | | 174/536 |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 7/2004 | Kim et al. | |
| 6,791,195 B2 | 9/2004 | Urushima | |
| 6,879,041 B2 | 4/2005 | Yamamoto et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 6/2006 | Kellar et al. | |
| 7,056,807 B2 | 6/2006 | Kellar et al. | |
| 7,087,538 B2 | 8/2006 | Staines et al. | |
| 7,098,542 B1 | 8/2006 | Hoang et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,217,994 B2 * | 5/2007 | Zhu | H01L 23/5385 |
| | | | 257/686 |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,632,719 B2 | 12/2009 | Choi et al. | |
| 7,659,632 B2 | 2/2010 | Tsao et al. | |
| 7,834,450 B2 | 11/2010 | Kang | |
| 7,928,582 B2 | 4/2011 | Hutto | |
| 8,164,171 B2 | 8/2012 | Lin et al. | |
| 8,284,561 B2 | 10/2012 | Su et al. | |
| 8,361,842 B2 | 1/2013 | Yu et al. | |
| 8,519,537 B2 | 8/2013 | Jeng et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 | 8/2014 | Lin et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,865,521 B2 | 10/2014 | Jeng et al. | |
| 8,877,554 B2 | 11/2014 | Tsai et al. | |
| 8,896,109 B2 | 11/2014 | Pagaila et al. | |
| 8,970,023 B2 | 3/2015 | Chou et al. | |
| 9,564,416 B2 | 2/2017 | Hou et al. | |
| 9,653,442 B2 * | 5/2017 | Yu | H01L 25/18 |
| 2002/0003232 A1 | 1/2002 | Ahn et al. | |
| 2002/0003297 A1 | 1/2002 | Smola et al. | |
| 2002/0081755 A1 | 6/2002 | Degani et al. | |
| 2003/0035270 A1 * | 2/2003 | Shieh | H01L 23/055 |
| | | | 361/718 |
| 2004/0056344 A1 | 3/2004 | Ogawa et al. | |
| 2004/0245608 A1 | 12/2004 | Huang et al. | |
| 2005/0104196 A1 * | 5/2005 | Kashiwazaki | H01L 23/13 |
| | | | 257/706 |
| 2006/0113653 A1 | 6/2006 | Xiaoqi et al. | |
| 2006/0145328 A1 * | 7/2006 | Hsu | H01L 23/5389 |
| | | | 257/690 |
| 2006/0249828 A1 | 11/2006 | Hong | |

(56) References Cited

U.S. PATENT DOCUMENTS

| | | |
|---|---|---|
| 2007/0289127 A1 | 12/2007 | Hurwitz et al. |
| 2007/0290319 A1 | 12/2007 | Kim |
| 2008/0116589 A1 | 3/2008 | Sinha |
| 2008/0185719 A1 | 8/2008 | Cablao et al. |
| 2008/0248610 A1 | 10/2008 | Chew et al. |
| 2008/0265434 A1* | 10/2008 | Kurita ............... H01L 21/563 257/777 |
| 2008/0272477 A1 | 11/2008 | Do et al. |
| 2008/0283992 A1 | 11/2008 | Palaniappan et al. |
| 2008/0315372 A1 | 12/2008 | Kuan et al. |
| 2009/0065927 A1* | 3/2009 | Meyer ............... H01L 21/561 257/693 |
| 2009/0121326 A1 | 5/2009 | Kim et al. |
| 2009/0186446 A1 | 7/2009 | Kwon et al. |
| 2009/0230531 A1 | 9/2009 | Do et al. |
| 2009/0243065 A1 | 10/2009 | Sugino et al. |
| 2009/0309212 A1 | 12/2009 | Shim et al. |
| 2009/0321921 A1 | 12/2009 | Hwang |
| 2010/0019370 A1 | 1/2010 | Pressel et al. |
| 2010/0052135 A1 | 3/2010 | Shim et al. |
| 2010/0102428 A1 | 4/2010 | Lee et al. |
| 2010/0244219 A1 | 9/2010 | Pagaila et al. |
| 2010/0276787 A1 | 11/2010 | Yu et al. |
| 2010/0314749 A1 | 12/2010 | Kurita |
| 2011/0024888 A1 | 2/2011 | Pagaila et al. |
| 2011/0193221 A1* | 8/2011 | Hu ............... H01L 21/563 257/737 |
| 2011/0210444 A1 | 9/2011 | Jeng et al. |
| 2011/0241192 A1 | 10/2011 | Ding et al. |
| 2011/0278732 A1 | 11/2011 | Yu et al. |
| 2011/0285005 A1* | 11/2011 | Lin ............... H01L 21/4846 257/686 |
| 2011/0291288 A1 | 12/2011 | Wu et al. |
| 2011/0304999 A1 | 12/2011 | Yu et al. |
| 2012/0049352 A1 | 3/2012 | Kang et al. |
| 2012/0286407 A1 | 11/2012 | Choi et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0075903 A1 | 3/2013 | Pagaila et al. |
| 2013/0082364 A1 | 4/2013 | Wang et al. |
| 2013/0119533 A1* | 5/2013 | Chen ............... H01L 21/78 257/737 |
| 2013/0168848 A1 | 7/2013 | Lin et al. |
| 2013/0200529 A1* | 8/2013 | Lin ............... H01L 24/94 257/777 |
| 2013/0203215 A1* | 8/2013 | Hung ............... H01L 24/94 438/107 |
| 2013/0214426 A1* | 8/2013 | Zhao ............... H01L 24/17 257/774 |
| 2013/0249532 A1* | 9/2013 | Lin ............... H01L 22/14 324/149 |
| 2013/0252378 A1 | 9/2013 | Jeng et al. |
| 2013/0307140 A1 | 11/2013 | Huang et al. |
| 2014/0091473 A1* | 4/2014 | Len ............... H01L 24/05 257/774 |
| 2014/0131858 A1* | 5/2014 | Pan ............... H01L 24/13 257/737 |
| 2014/0203429 A1 | 7/2014 | Yu et al. |
| 2014/0217610 A1 | 8/2014 | Jeng et al. |
| 2014/0225222 A1 | 8/2014 | Yu et al. |
| 2014/0252646 A1 | 9/2014 | Hung et al. |
| 2014/0252647 A1* | 9/2014 | Huang ............... H01L 23/49827 257/774 |
| 2014/0264930 A1 | 9/2014 | Yu et al. |
| 2014/0353823 A1 | 12/2014 | Park et al. |
| 2015/0235915 A1 | 8/2015 | Liang et al. |
| 2015/0235936 A1 | 8/2015 | Yu et al. |
| 2015/0235989 A1 | 8/2015 | Yu et al. |
| 2015/0235990 A1 | 8/2015 | Cheng et al. |
| 2015/0235993 A1 | 8/2015 | Cheng et al. |
| 2016/0240508 A1 | 8/2016 | Hou et al. |
| 2017/0229432 A1* | 8/2017 | Lin ............... H01L 25/105 |
| 2017/0338177 A1* | 11/2017 | Lin ............... H01L 23/49838 |
| 2017/0345788 A1* | 11/2017 | Pan ............... H01L 24/82 |

FOREIGN PATENT DOCUMENTS

| | | |
|---|---|---|
| JP | 2008103536 A | 5/2008 |
| JP | 4339309 B2 | 10/2009 |
| KR | 20090028687 A | 3/2009 |
| KR | 20090122277 A | 11/2009 |
| KR | 20100119507 A | 11/2010 |
| KR | 20120019091 A | 3/2012 |
| KR | 20130077031 A | 7/2013 |

OTHER PUBLICATIONS

Kurita et al., "SMAFTI Package Technology Features Wide-Band and Large-Capacity Memory", Innovative Common Technologies to Support State-of-the-Art Products, pp. 52-56.

Motohashi et al., "SMAFTI Package with Planarized Multilayer Interconnects", IEEE, Electronic Components and Technology Conference, 2009, pp. 599-606.

Kurita et al., "SMAFTI Packaging Technology for New Interconnect Hierarchy", IEEE, NEC Electronics Corporation Sagamihara, Kanagawa, 229-1198, Japan, 2009, pp. 220-222.

\* cited by examiner

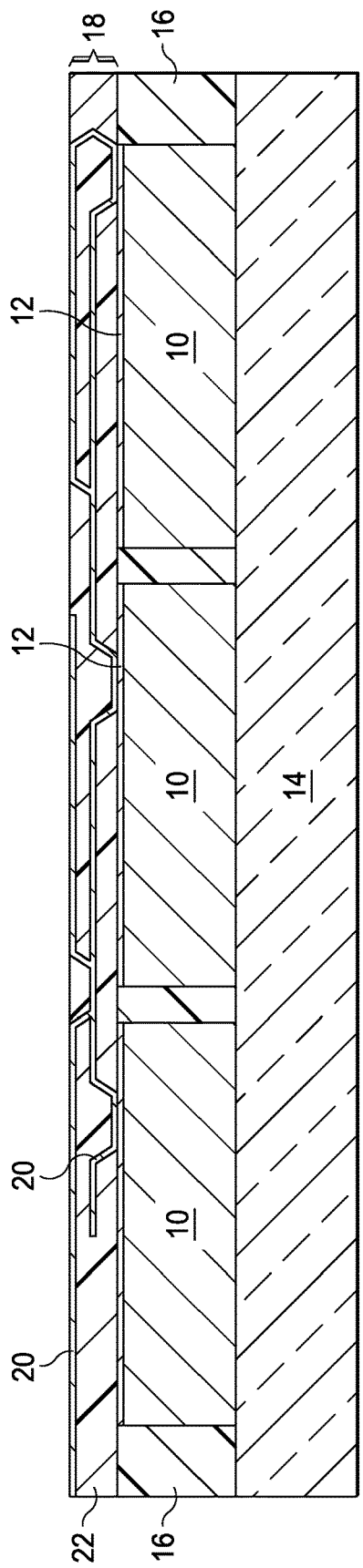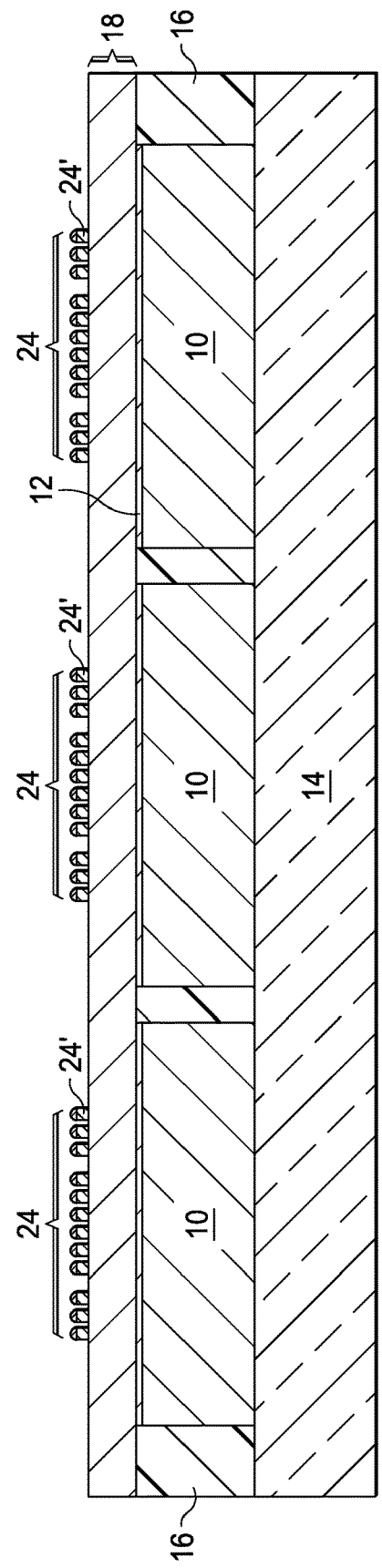

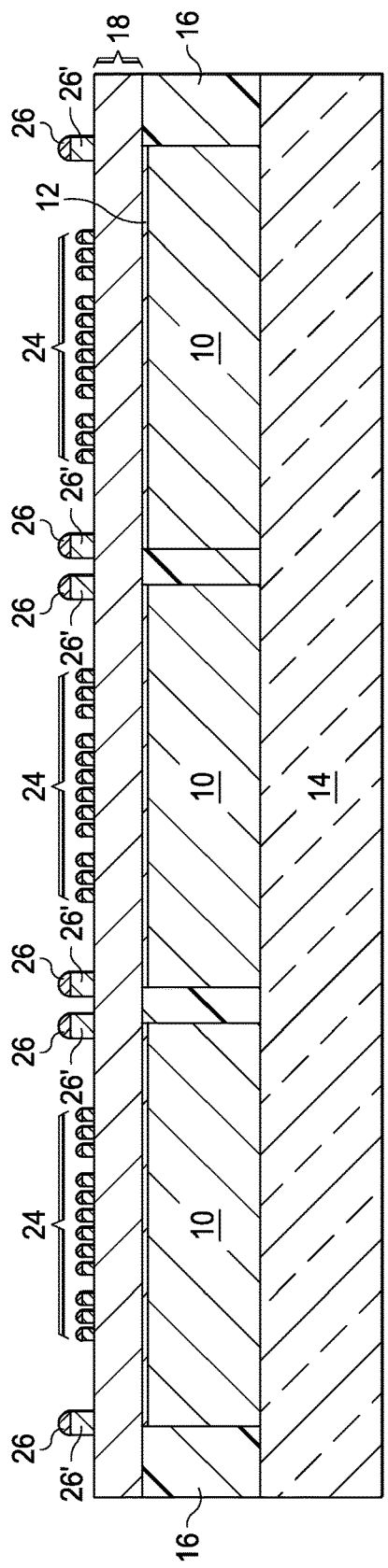
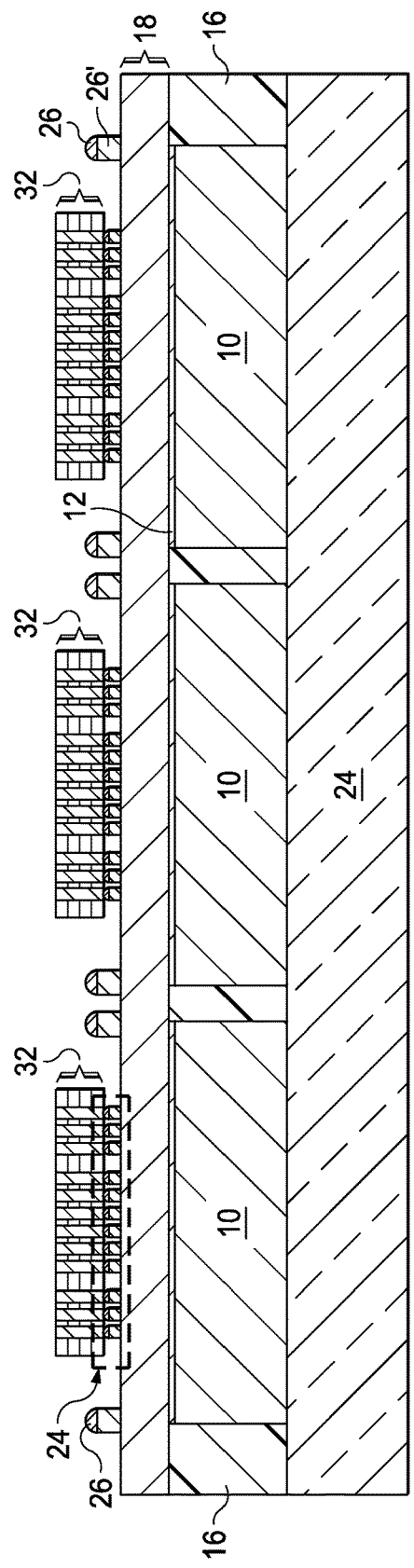
FIG. 1G
FIG. 1H

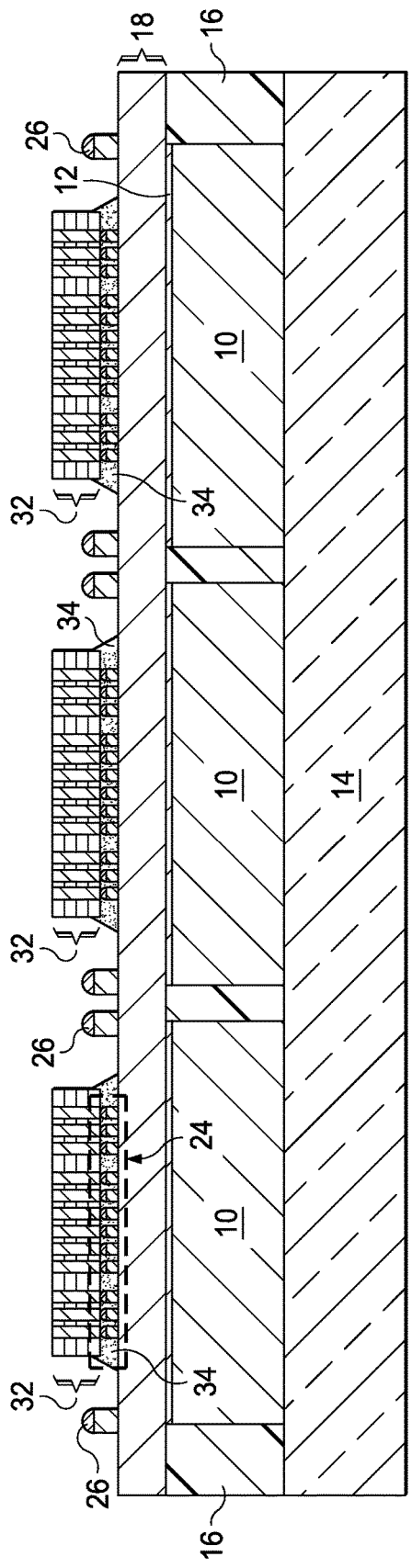
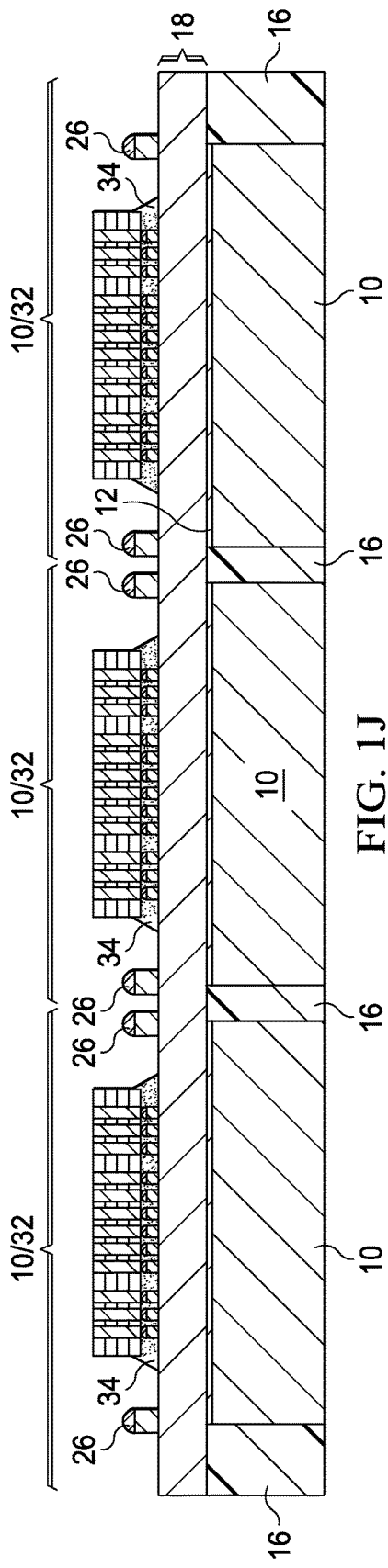
FIG. 1I
FIG. 1J

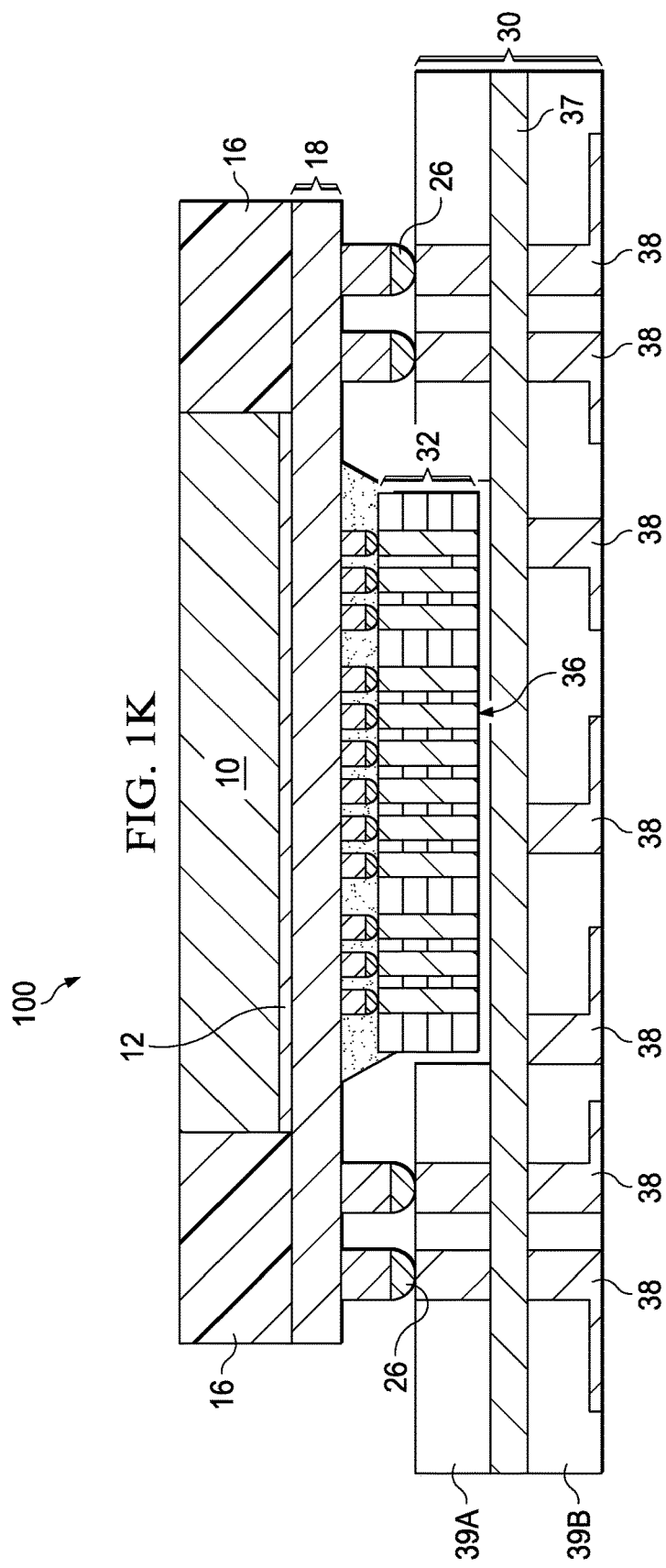

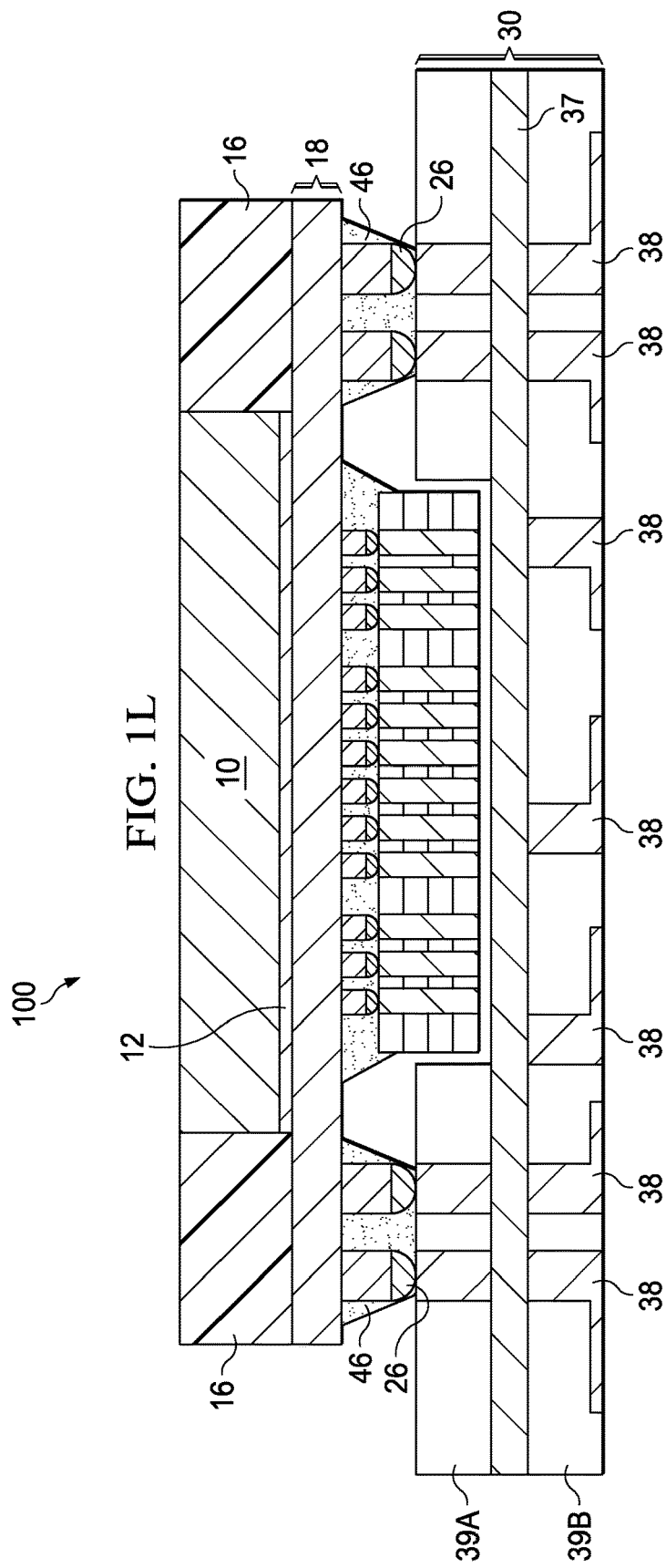

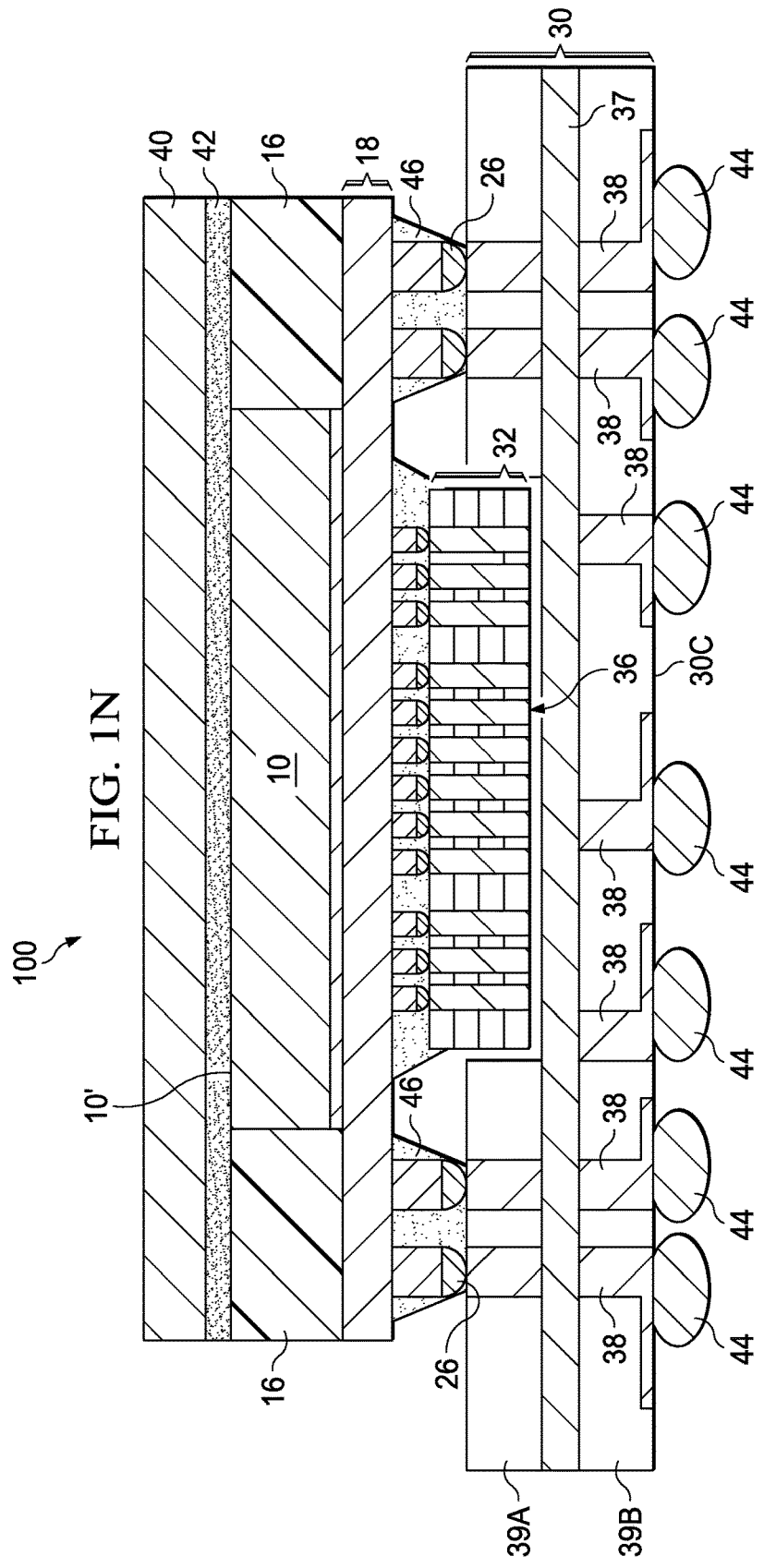

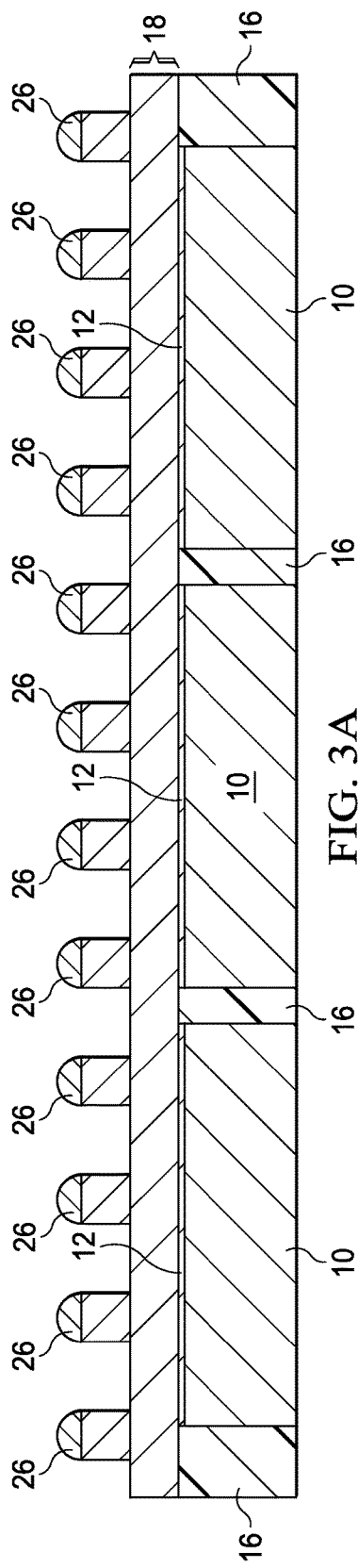
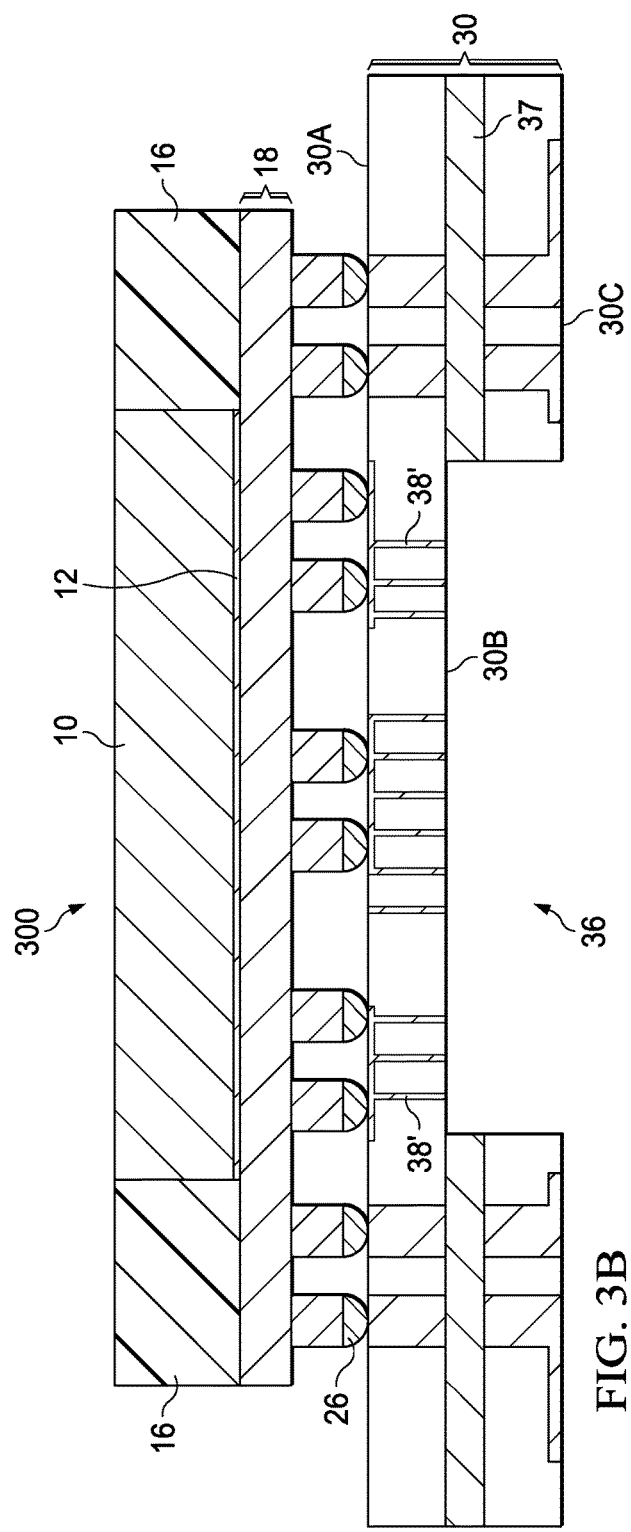
FIG. 3A
FIG. 3B

SUBSTRATE DESIGN FOR SEMICONDUCTOR PACKAGES AND METHOD OF FORMING SAME

CROSS-REFERENCE

This application relates to the following co-pending and commonly assigned U.S. patent application Ser. No.: 14/181,305, filed Feb. 14, 2014, entitled "Thermal Performance Structure for Semiconductor Packages and Method of Forming Same," which application is hereby incorporated herein by reference.

BACKGROUND

In an aspect of integrated circuit packaging technologies, individual semiconductor dies may formed and are initially isolated. These semiconductor dies may then be bonded together, and the resulting die stack may be connected to other package components such as package substrates (e.g., interposers, printed circuit boards, and the like) using connectors on a bottom die of the die stack.

The resulting packages are known as Three-Dimensional Integrated Circuits (3DICs). Top dies of a die stack may be electrically connected to the other package components through interconnect structures (e.g., through-substrate vias (TSVs)) in bottom dies of the die stack. However, existing 3DIC packages may include numerous limitations. For example, the bonded die stack and other package components may result in a large form factor and may require complex heat dissipation features. Furthermore, existing interconnect structures (e.g., TSVs) of the bottom die may be costly to manufacture and result in long conduction paths (e.g., signal/power paths) to top dies of the die stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3E illustrate cross-sectional views of various intermediary stages of manufacturing a semiconductor package in accordance with some alternative embodiments;

DETAILED DESCRIPTION

Figure 1A:
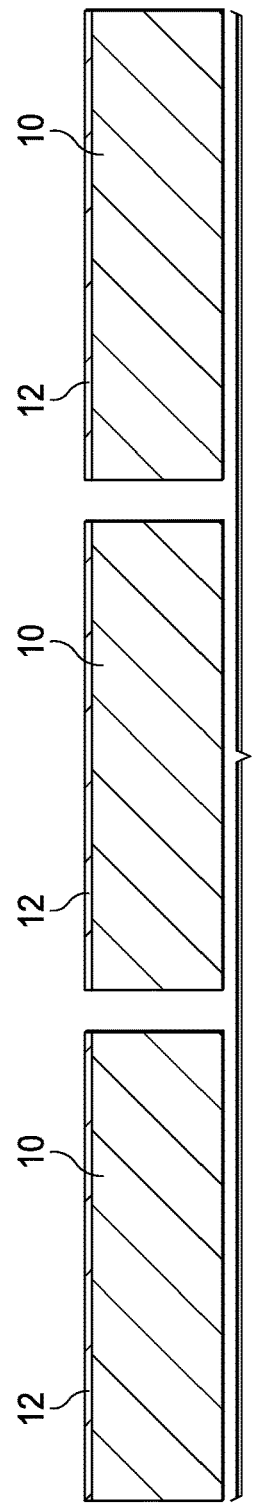
FIGS. 1A through 1N illustrate cross-sectional views of various intermediary stages of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments may include a plurality of first dies (e.g., memory dies) electrically connected to one or more second dies (e.g., logic dies) through first input/output (I/O) pads and redistribution layers (RDLs) formed on the second dies. The resulting die stack may be bonded to another package component such as an interposer, package substrate, printed circuit board, and the like through second I/O pads and the RDLs of the second dies. The package substrate may include a cavity, and the first dies may be disposed in the cavity. Thus, a three-dimensional integrated circuit (3DIC) such as a chip on fan-out package may be made with a relatively small form factor at a relatively low cost and having relatively short conduction paths (e.g., signal/power paths). Furthermore, one or more heat dissipation features may be independently formed on opposite surfaces of the first and/or second dies.

FIGS. 1A through 1N illustrate cross-sectional views of various intermediary stages of manufacturing an integrated circuit (IC) package 100 (see FIG. 1N) in accordance with various embodiments. FIG. 1A illustrates a plurality of dies 10. Dies 10 may include a substrate, active devices, and interconnect layers (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. Interconnect layers may be formed over the active devices and the substrate.

The interconnect layers may include an inter-layer dielectric (ILD)/inter-metal dielectric layers (IMDs) formed over the substrate. The ILD and IMDs may be formed of low-k dielectric materials having k values, for example, lower than about 4.0 or even about 2.8. In some embodiments, the ILD and IMDs comprise silicon oxide, SiCOH, and the like.

A contact layer 12 including one or more contact pads is formed over the interconnect structure and may be electrically coupled to the active devices through various metallic lines and vias in the interconnect layers. Contact pads in contact layer 12 may be made of a metallic material such as aluminum, although other metallic materials may also be used. A passivation layer (not shown) may be formed over contact layer 12 out of non-organic materials such as silicon oxide, un-doped silicate glass, silicon oxynitride, and the like. The passivation layer may extend over and cover edge portions of contact pads in contact layer 12. Openings may be formed in portions of the passivation layer that cover the contact pads, exposing at least a portion of the contact pads in contact layer 12. The various features of dies 10 may be formed by any suitable method and are not described in further detail herein. Furthermore, dies 10 may be formed in a wafer (not shown) and singulated. Functional testing may be performed on dies 10. Thus, dies 10 in FIG. 1A may include only known good dies, which have passed one or more functional quality tests.

Figure 1B:
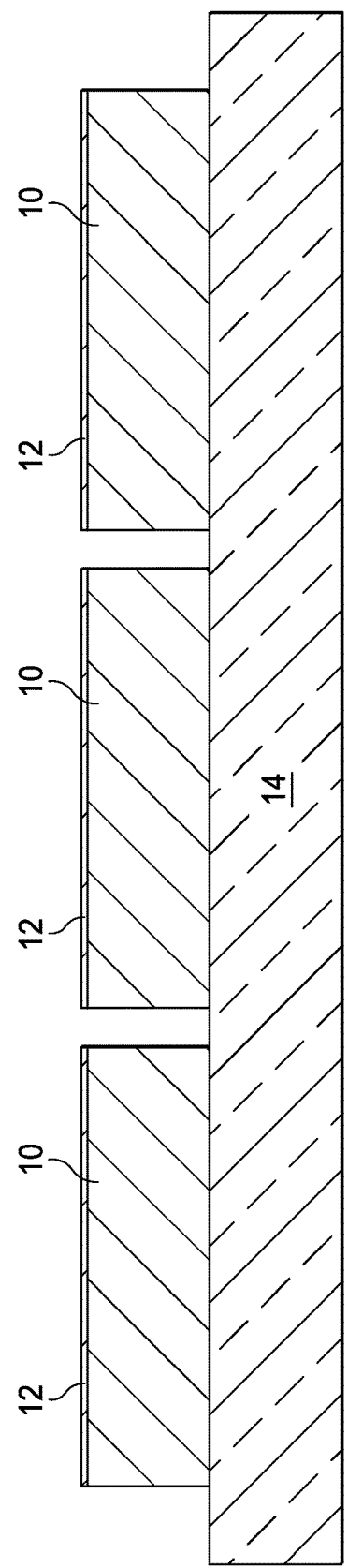

Next, referring to FIG. 1B, dies 10 may be placed on a carrier 14. Carrier 14 may be made of a suitable material, for example, glass or a carrier tape. Dies 10 may be affixed to carrier 14 through one or more adhesive layers (not shown). The adhesive layers may be formed of any temporary adhesive material such as ultraviolet (UV) tape, wax, glue, and the like. In some embodiments, the adhesive layers may further include a die attach film (DAF), which may have optionally been formed under dies 10 prior to their placement on carrier 14.

Figure 1C:
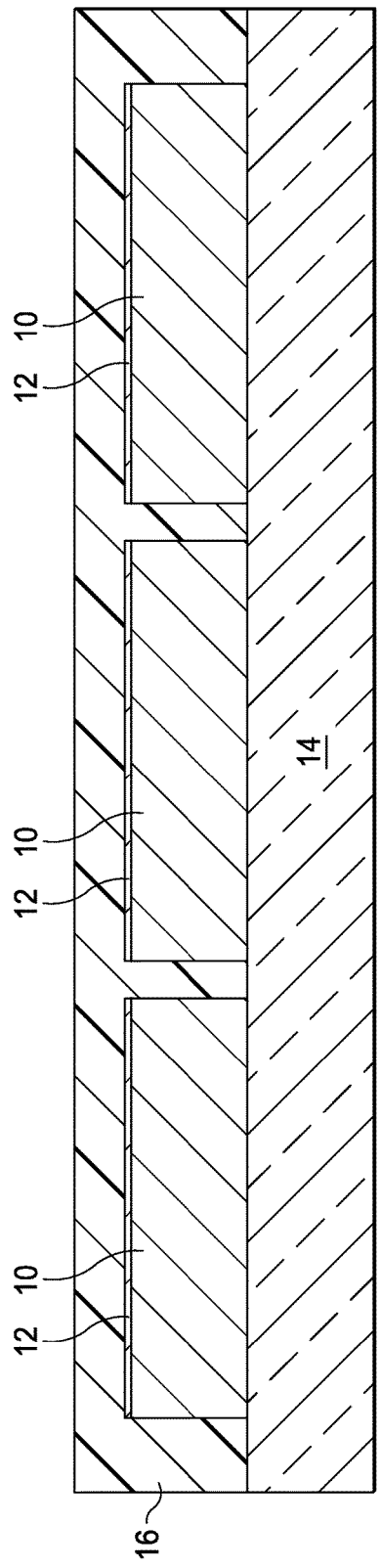

In FIG. 1C, a molding compound 16 may be used to fill gaps between dies 10 and to cover top surfaces of dies 10. Molding compound 16 may include any suitable material such as an epoxy resin, a molding underfill, and the like. Suitable methods for forming molding compound 16 may include compressive molding, transfer molding, liquid encapsulent molding, and the like. For example, molding compound 16 may be dispensed between dies 10 in liquid form. A curing process may then be performed to solidify molding compound 16.

Figure 1D:
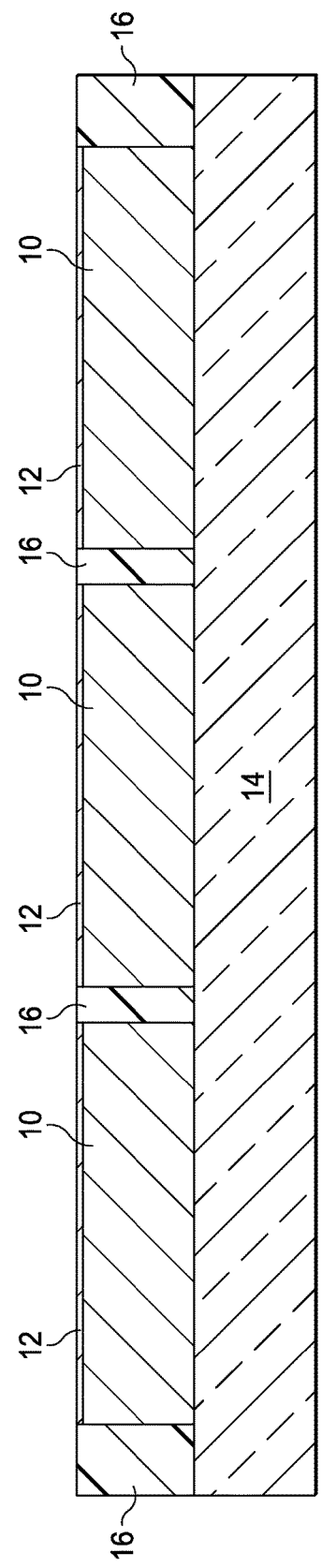

In FIG. 1D, a planarization process, such as a grinding process (e.g., a chemical-mechanical polish (CMP) or mechanical grinding) or etch back, may be performed on molding compound 16 to expose contact layer 12 (and any contact pads therein) on dies 10. In a top down view of dies 10 (not shown), molding compound 16 may encircle dies 10.

FIG. 1E illustrates the formation of redistribution layers (RDLs) 18 over dies 10 and molding compound 16. As illustrated by FIG. 1E, RDLs 18 may extend laterally past edges of dies 10 over molding compound 16. RDLs 18 may include interconnect structures 20 formed in one or more polymer layers 22. Polymer layers 22 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, and the like.

Interconnect structures 20 (e.g., conductive lines and/or vias) may be formed in polymer layers 22 and electrically connected to contact layer 12 of dies 10. The formation of interconnect structures 20 may include patterning polymer layers 22 (e.g., using a combination of photolithography and etching processes) and forming interconnect structures 20 (e.g., depositing a seed layer and using a mask layer to define the shape of interconnect structures 20) in the patterned polymer layers 22. Interconnect structures 20 may be formed of copper or a copper alloy although other metals such as aluminum, gold, and the like may also be used. Interconnect structures 20 may be electrically connected to contact pads in contact layer 12 (and as a result, active devices) in dies 10.

FIGS. 1F and 1G illustrate the formation of connectors 24 and 26 over RDLs 18. Notably, connectors 24 and 26 are formed on a same side of dies 10 (i.e., on a same surface of RDLs 18). Connectors 24 and 26 may be formed of any suitable material (e.g., copper, solder, and the like) using any suitable method. In some embodiments, the formation of connectors 24 and 26 may first include the formation of under bump metallurgies (UBMs) 24'/26' electrically connected to active devices in dies 10 through RDLs 18. Connectors 24 and 26 may extend laterally past edges of dies 10, forming fan-out interconnect structures. Thus, the inclusion of RDLs 18 may increase the number of connectors 24 and 26 (e.g., input/output pads) connected to dies 10. The increased number of connectors 24 and 26 may allow for increased bandwidth, increased processing speed (e.g., due to shorter signaling paths), lower power consumption (e.g., due to shorter power conduction paths), and the like in subsequently formed IC packages (e.g., package 100 of FIG. 1N).

Furthermore, connectors 24 and 26 may vary in size. For example, connectors 24 may be microbumps having a pitch of about 40 μm or more while connectors 26 may be controlled collapse chip connection (C4) bumps having a pitch of about 140 μm to about 150 μm. In alternative embodiments, connectors 24 and 26 may include different dimensions. Thus, as illustrated by FIGS. 1F and 1G, connectors 24 may be formed prior to connectors 26 to allow for the size differences.

The differing sizes of connectors 24 and 26 may allow different electrical devices (e.g., having differently sized connectors) to be bonded to dies 10. For example, connectors 24 may be used to electrically connect dies 10 to one or more other device dies 28 (see FIG. 1H), and connectors 26 may be used to electrically connect dies 10 to a package substrate 30 (e.g., a printed circuit board, interposer, and the like, see FIG. 1K). Furthermore, because connectors 24 and 26 are formed on a same side of dies 10, the different electrical devices may also be bonded to a same side of dies 10. Although a particular configuration of dies 10 and RDLs 18 is illustrated, alternative configurations may be applied (e.g., having a different number of RDLs 18 and/or connectors 24/26) in alternative embodiments.

In FIG. 1H, a plurality of dies 32 may be bonded to dies 10 through connectors 24 (e.g., by reflowing connectors 24) to form die stacks 10/32. Dies 32 may be electrically connected to active devices in dies 10 through RDLs 18. In some embodiments, die stack 10/32 may include memory dies 32 (e.g., dynamic random access memory (DRAM) dies) bonded to dies 10, which may be logic dies providing control functionality for memory dies 32. In alternative embodiments, other types of dies may be included in dies stacks 10/32. Next, as illustrated in FIG. 1I, underfill 34 may be dispensed between dies 32 and RDLs 18 around connectors 24. Underfill 34 may provide support for connectors 24.

FIG. 1J illustrates the removal of carrier 14 from die stack 10/32 using any suitable method. For example, in an embodiment in which the adhesive between dies 10 and carrier 14 is formed of UV tape, dies 10 may be removed by exposing the adhesive layer to UV light. Subsequently, die stacks 10/34 may be singulated for packaging in an IC package. The singulation of die stacks 10/34 may include the use of a suitable pick-and-place tool.

Next, as illustrated by FIG. 1K, each die stack 10/32 may be bonded to a package substrate 30 through connectors 26. A reflow may be performed on connectors 26 to bond die stack 10/32 to package substrate 30. Subsequently, as illustrated by FIG. 1L, an underfill 46 maybe dispensed between die stack 10/32 and package substrate 30 around connectors 26. Underfill 46 may be substantially similar to underfill 34.

Package substrate 30 may be an interposer, a printed circuit board (PCB), and the like. For example, package substrate 30 may include a core 37 and one or more build-up layers 39 (labeled 39A and 39B) disposed on either side of core 37. Interconnect structures 38 (e.g., conductive lines, vias, and/or through vias) may be included in package substrate 30 to provide functional electrical purposes such as power, ground, and/or signal layers. Other configurations of package substrate 30 may also be used.

Furthermore, package substrate 30 may include a cavity 36. Cavity 36 may not extend through package substrate 30. Rather, a portion or all of build-up layers 39A (e.g., build-up layers 39 disposed on a same side of core 37 as die stack 10/32) may be patterned to form cavity 36. As illustrated in FIG. 1L, cavity 36 may not affect the configuration of core 37 and/or build-up layers 39B (e.g., build-up layers 39 disposed on an opposite side of core 37 as die stack 10/32). The configuration of package substrate 30 may be designed so that active interconnect structures 38 (e.g., power, ground, and/or signal layers in build-up layers 39A) may be routed to avoid cavity 36. Thus, cavity 36 may not substantially interfere with the functionality of package substrate 30.

Figure 4B:
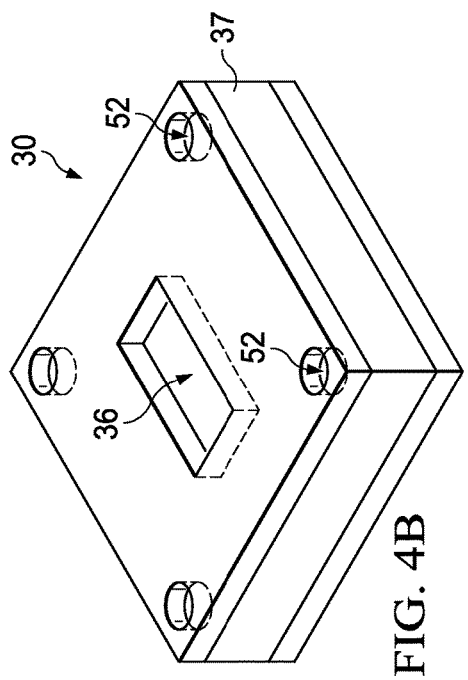
FIGS. 4A through 4L illustrate prospective views of various intermediary stages of manufacturing a package substrate in accordance with some embodiments.
Figure 4D:
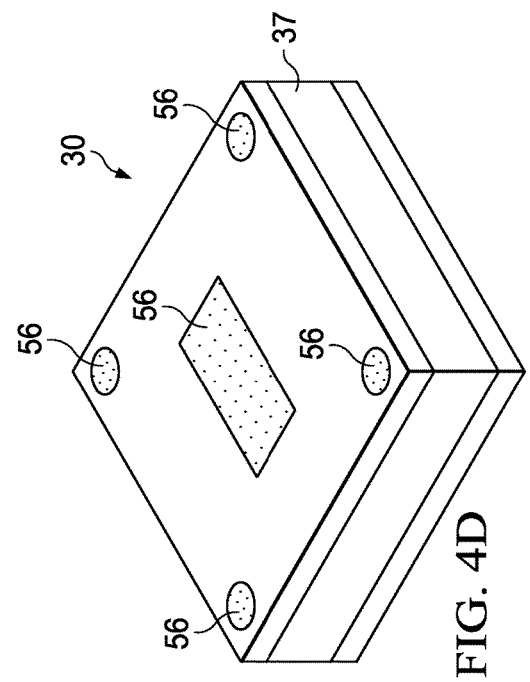
Figure 4A:
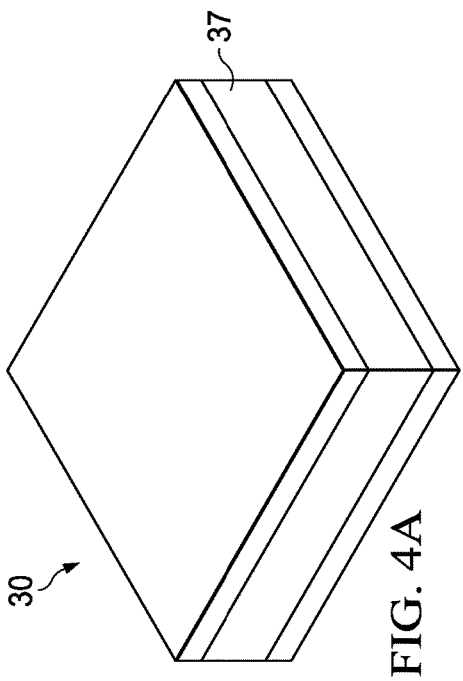

Package substrate 30 may be formed using any suitable method. For example, FIGS. 4A through 4L illustrate prospective views of various intermediary stages of manufacturing a package substrate 30 in accordance with various embodiments. In FIG. 4A, core 37 is provided. Core 36 may be a metal-clad insulated base material such as a copper-clad epoxy-impregnated glass-cloth laminate, a copper-clad polyimide-impregnated glass-cloth laminate, or the like. As illustrated by FIG. 4B, cavity 36 and/or through holes 52 may be formed in core 37, for example, using a mechanical drilling or milling process. The mechanical drilling/milling process may extend through holes 52 through core 37. However, the mechanical drilling/milling process may not extend cavity 36 through core 37.

Figure 4C:
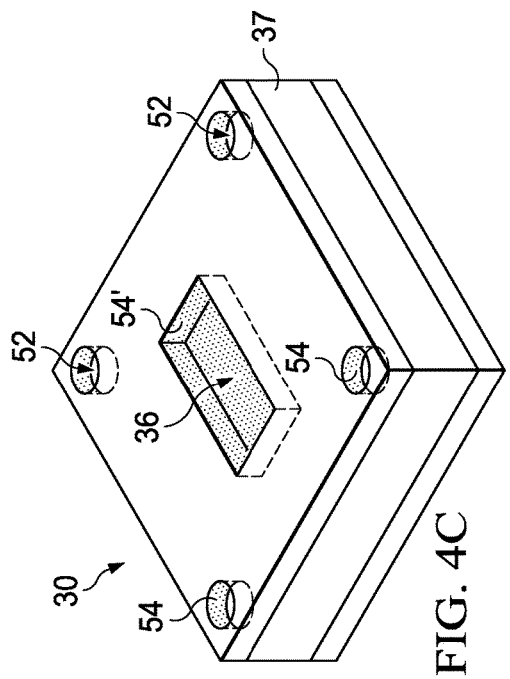

Next, in FIG. 4C, surfaces of through hole 52 and cavity 36 may be plated with metallic material 54, for example, using an electrochemical plating process. In some embodiments, metallic material 54 may comprise copper. The plating of through holes 52 may form through vias for providing electrical connections from one side of core 37 to another. Furthermore, metallic material 54' on surfaces of cavity 36 may act as a laser stop layer in subsequent process steps (see FIG. 4K). In FIG. 4D, cavity 36 and through holes 52 may be filled with a suitable material 56 (e.g, an ink). Material 56 may fill cavity 36/through holes 52 to provide a substantially level surface for forming one or more build-up layers over core 37. A grinding or other planarization technique may be performed on core 37.

Figure 4E:
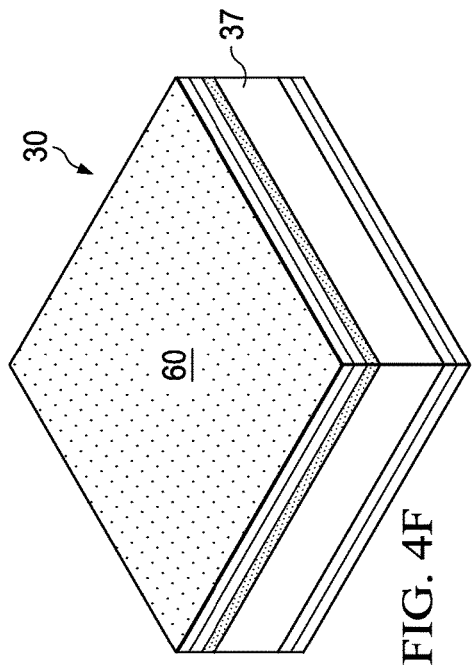
Figure 4F:
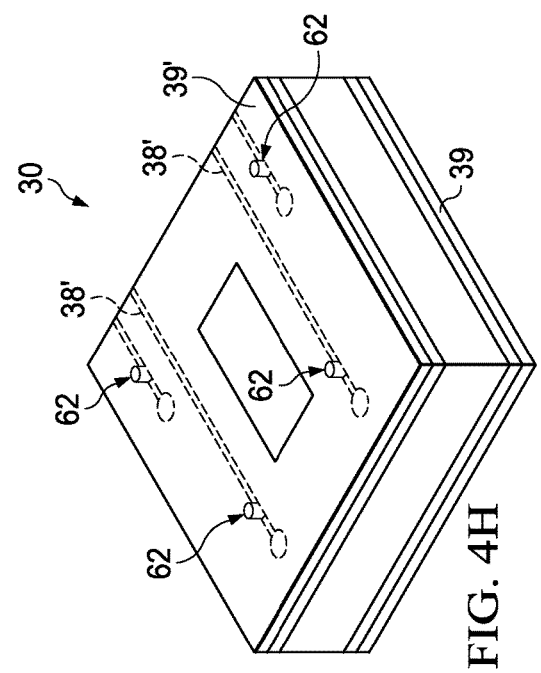
Figure 4G:
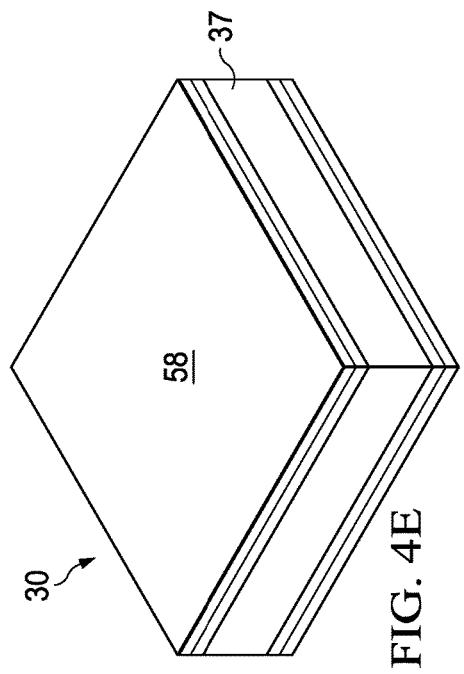

As illustrated by FIGS. 4E through 4I, one or more build-up layers 39 having interconnect structures 38 may be formed on either side of core 37. The formation of build-up layers 39 may include plating core 37 with a conductive layer 58, for example, comprising copper as illustrated by FIG. 4E. Next, as illustrated by FIGS. 4F and 4G, conductive layer 58 may be patterned to form conductive lines 38'. The patterning of conductive layer 58 may include laminating a dry film 60 (e.g., a photoresist) over conductive layer 58, patterning dry film 60 (e.g., using suitable exposure techniques), and etching conductive layer 58 using the patterned dry film 60 as a mask. Subsequently, dry film 60 may be removed.

Figure 4H:
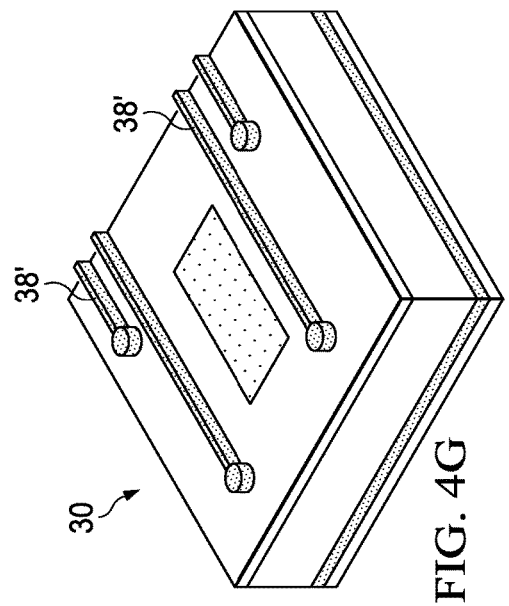
Figure 4I:
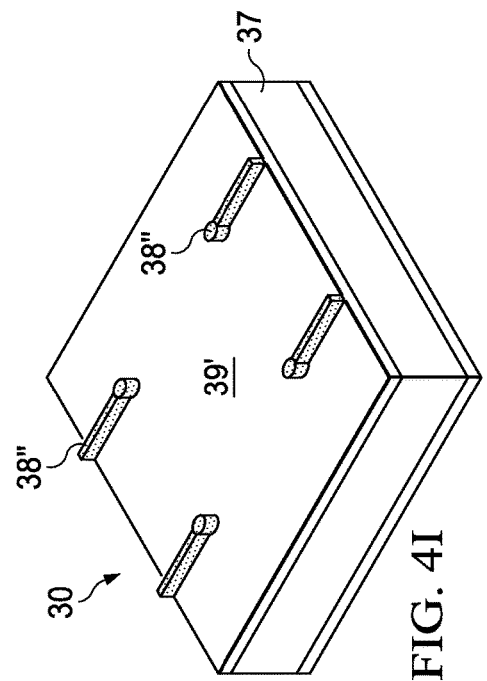

In FIG. 4H, a build-up layer 39' may be laminated over conductive lines 38' (shown in ghost). The lamination of build-up layer 39' may include a curing process (e.g., a heat treatment or pressing process). Openings 62 may be patterned in build-up layer 39' (e.g., through laser drilling), and openings 62 may be aligned with conductive lines 38'. As illustrated by FIG. 4I, additional conductive lines 38" may be formed over build-up layer 39' using a substantially similar process as illustrated by FIGS. 4E through 4H for forming conductive lines 38' (e.g., conductive layer plating and patterning). The conductive layer plating process used for forming conductive lines 38" may also plate openings 62 (not illustrated in FIG. 4H), thus forming conductive vias (not illustrated) for interconnecting conductive lines 38' and 38" through build-up layer 39'. Conductive lines 38" may be patterned to align with conductive vias formed in openings 62. The process steps illustrated by FIGS. 4E through 4I may be repeated as desired to form any number of build-up layers (e.g., power, ground, and/or signal layers) in package substrate 30. Furthermore, although FIGS. 4E through 4I only illustrate the formation of interconnect structures 38/build-up layers 39 on one side of core 37, similar processes may be applied to form of interconnect structures 38/build-up layers 39 on an opposing side of core 37.

Figure 4J:
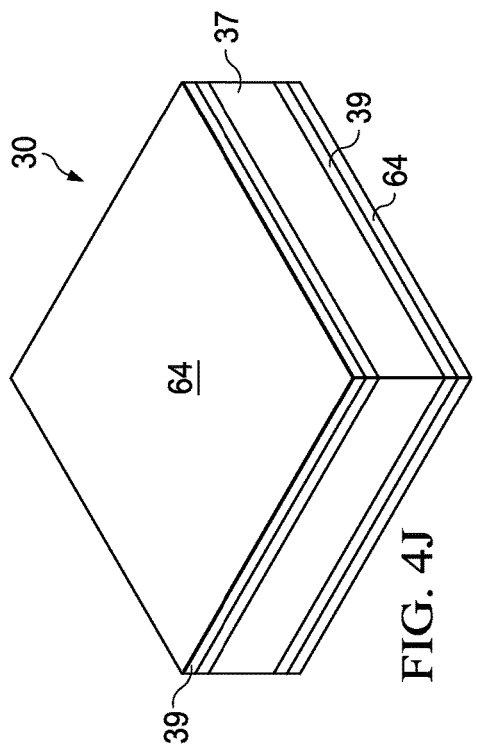
Figure 4K:
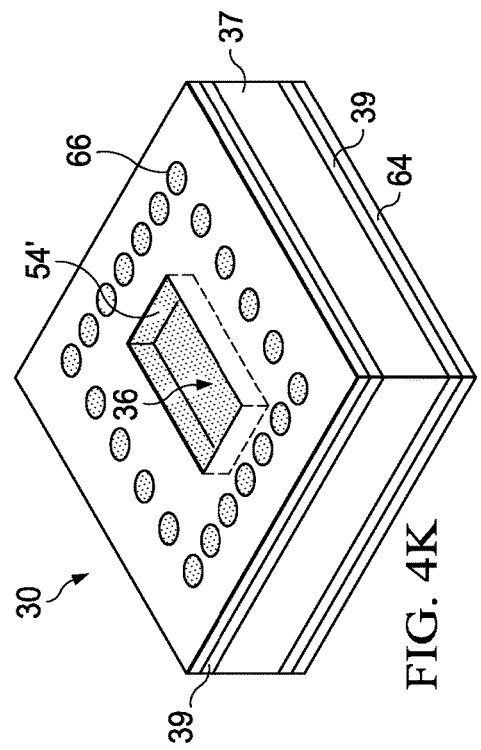
Figure 4L:
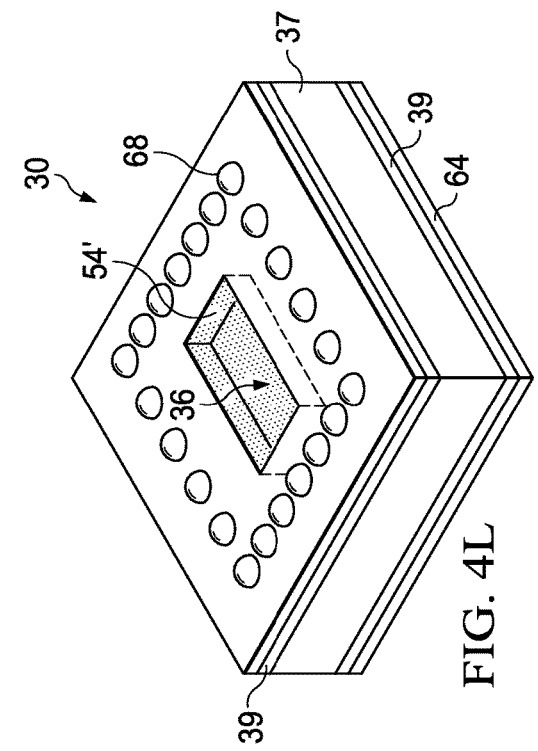

FIG. 4J a solder resist 64 may be formed over build-up layers 39 (e.g., on both sides of core 37). Next, as illustrated by FIG. 4K, cavity 36 may be patterned in package substrate 30. The formation of cavity 36 may include patterning solder resist 63 (e.g., using an exposure technique) and a laser etching build-up layers 39 using material 54' as a laser stop layer. Thus, cavity 36 may not extend through package substrate 30. Furthermore, the patterning of solder resist 64 may pattern openings (not shown) around cavity 36 to expose interconnect structures 38 in build-up layers 39. These openings may be plated with a suitable material (e.g., nickel, aluminum, or the like) to form contact pads 66 on package substrate 30. Contact pads 66 may be electrically connected to interconnect structures 38 in build-up layers 39. Subsequently, as illustrated by FIG. 4L, connectors 68 (e.g., solder balls) may be formed on contact pads 66 for bonding with die stack 10/32.

Referring back to FIG. 1L, when die stack 10/34 is bonded to package substrate 30, dies 32 may be disposed, at least partially, in cavity 36. In a top down view of package 100 (not shown), cavity 36 may encircle dies 32. Thus, the bonded structure may advantageously have a relatively small form factor and higher bandwidth. Furthermore, dies 32 may be electrically connected to package substrate 30 through RDLs 18 and connectors 24/26. In some embodiments, dies 10 may include fewer or be substantially free of through-substrate vias (TSVs) for electrically connecting dies 32 to package substrate 30. The reduced number of TSVs may lower the cost of manufacturing dies 10.

Figure 1M:
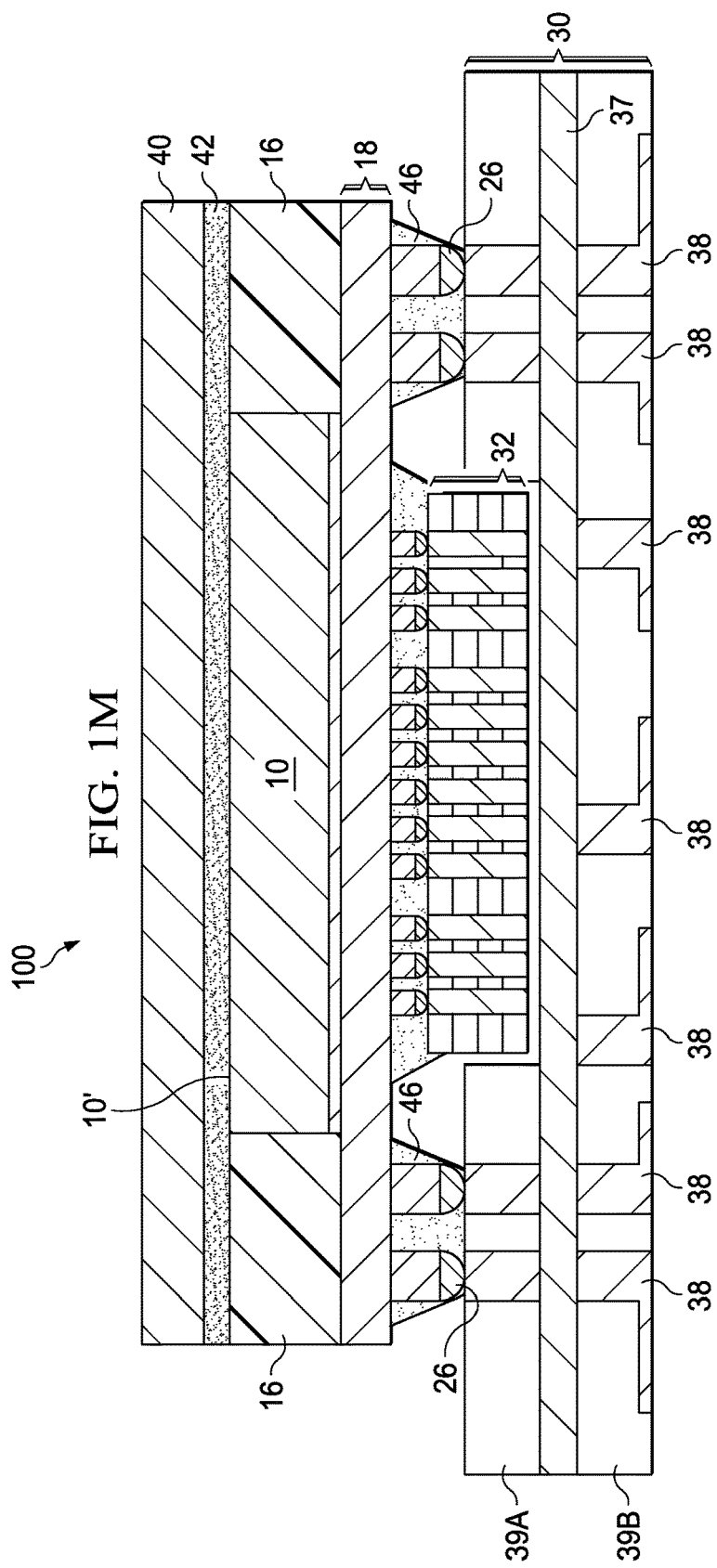

Next, referring to FIG. 1M, a heat dissipation feature 40 is disposed over die 10. Heat dissipation feature 40 may be disposed on a surface of die 10 opposite RDLs 18, connectors 24, and dies 32. Heat dissipation feature 40 may be a contour lid having a high thermal conductivity, for example, between about 200 watts per meter kelvin (W/m·K) to about 400 W/m·K or more, and may be formed using a metal, a metal alloy, and the like. For example, heat dissipation feature 40 may comprise metals and/or metal alloys such as Al, Cu, Ni, Co, combinations thereof, and the like. Heat dissipation feature 40 may also be formed of a composite material, for example silicon carbide, aluminum nitride, graphite, and the like. In some embodiments, heat dissipation feature 40 may also extend over surfaces of molding compound 16.

Compared to conventional 3DICs, where package substrate 30 and dies 32 would be disposed on opposing sides of die 10, package 100 provides die 10 with a surface 10', which may not be used to electrically connect to dies 32 or package substrate 30. Thus, heat dissipation feature 40 may be directly disposed on surface 10' of die 10 for improved heat dissipation.

Interfacing material 42 may be disposed between heat dissipation features 40 and die 10/molding compound 16. Interfacing material 42 may include a thermal interface material (TIM), for example, a polymer having a good thermal conductivity, which may be between about 3 watts per meter kelvin (W/m·K) to about 5 W/m·K or more. Because the TIM may have good thermal conductivity, the TIM may be disposed directly between (e.g., contacting) die 10 and heat dissipation feature 40. Furthermore, interfacing material 42 may also include an adhesive (e.g., an epoxy, silicon resin, and the like) for affixing heat dissipation lid 40 to die 10/molding compound 16. The adhesive used may have a better adhering ability and a lower thermal conductivity than a TIM. For example, the adhesive used may have a thermal conductivity lower than about 0.5 W/m·K. As such, the adhesive portions of interfacing material 42 may be disposed over areas having lower thermal dissipation needs (e.g., over surfaces of molding compound 16).

After the attachment of heat dissipation feature 40, a marking process (e.g., laser marking) may be performed to mark package 100. Furthermore, as illustrated by FIG. 1N, connectors 44 (e.g., ball grid array (BGA) balls) disposed on a surface of package substrate 30 opposite connectors 26 and die stack 10/32. Connectors 44 may be used to electrically connect package 100 to a motherboard (not shown) or another device component of an electrical system.

FIG. 1N illustrates a completed package 100. Because dies 32 is disposed in a cavity 36 of package substrate 30, package 100 may have a relatively small form factor and higher bandwidth. The inclusion of RDL 18 may allow for a greater number of I/O pads for die stack 10/32, which allows various performance advantages such as increased speed, lower power consumption, and the like. Furthermore, package substrate 30 and dies 32 may be disposed on a same side of die 10, allowing heat dissipation feature 40 to be directly disposed on a surface of die 10 for improved heat dissipation.

Figure 2:
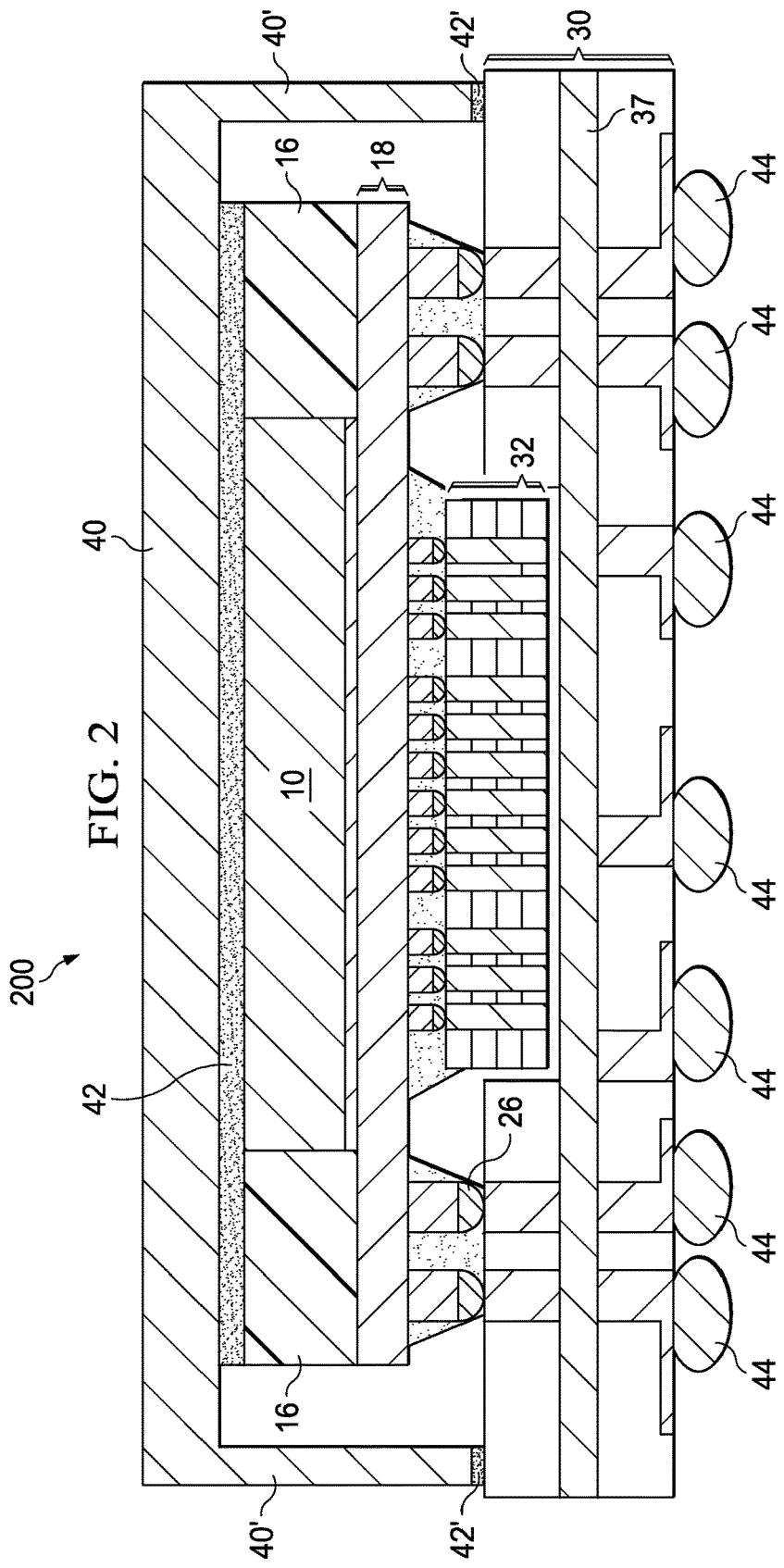
FIG. 2 illustrates a cross-sectional view a semiconductor package in accordance with some alternative embodiments.

FIG. 2 illustrates a cross-sectional view of a package 200 in accordance with various alternative embodiments. Package 200 may be substantially similar to the package 100 where like reference numerals represent like elements. However, heat dissipation feature 40 may include a contour ring portion 40', which may extend past die 10 and RDLs 18 to a top surface of package substrate 30. In a top down view of package 200 (not shown), contour ring portion 40' may encircle die 10. Contour ring portion 40' may be formed of substantially similar materials as the remainder of heat dissipation lid 40 (e.g., a high Tk material) and provide additional heat dissipation for package 200. Contour ring portion 40' may be attached to package substrate 30 using any suitable method such as an adhesive layer 42' disposed between contour ring portion 40' and package substrate 30.

Figure 3C:
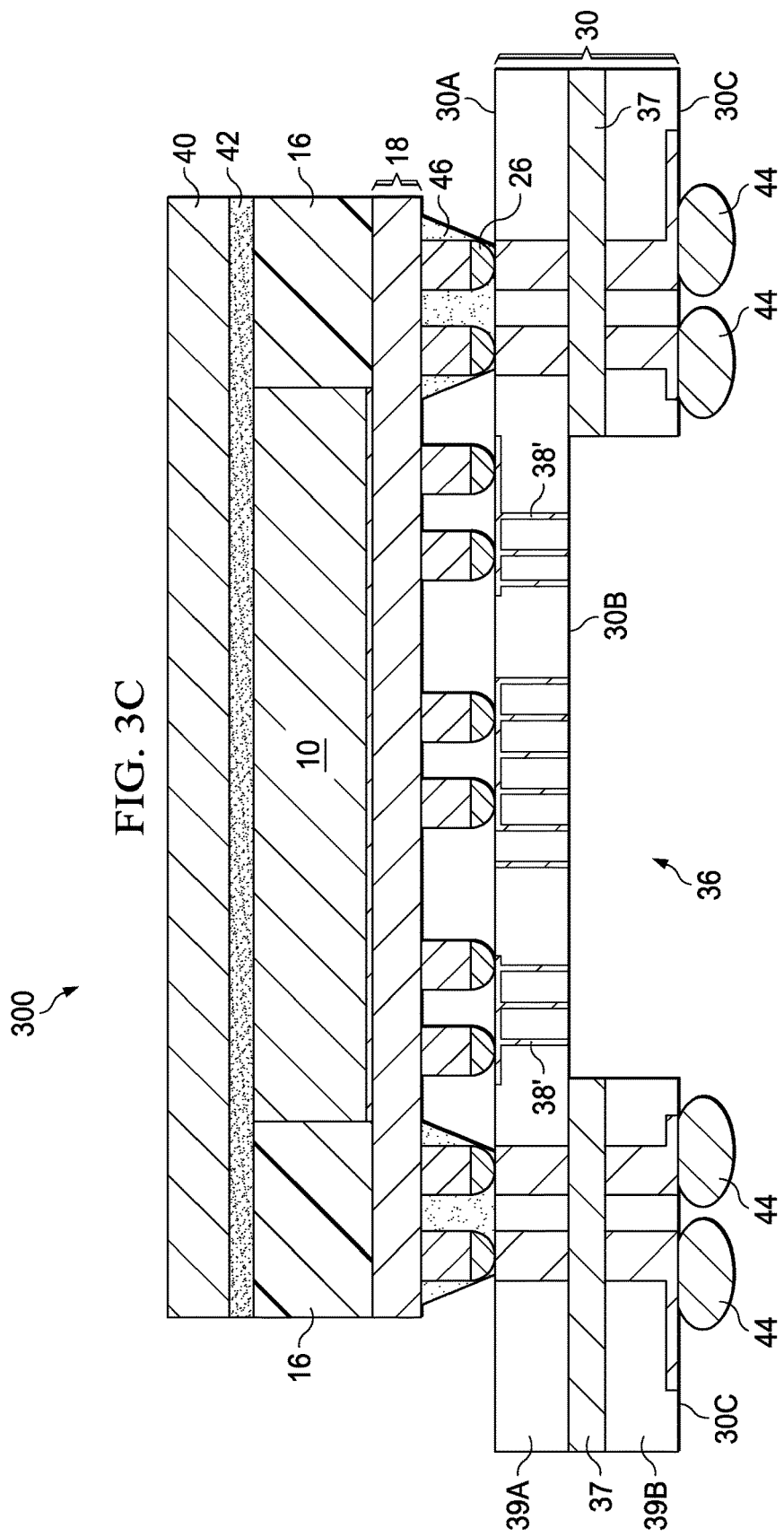

FIGS. 3A through 3E illustrates various intermediary steps of manufacturing package 300 in accordance with alternative embodiments. FIG. 3A illustrates a plurality of dies 10 having an RDL 18 and connectors 26 formed over dies 10. The various features illustrated in FIG. 3A may be formed using substantially the same steps and be substantially similar to the features formed in FIGS. 1A through 1J where like reference numerals represent like elements. Thus, detailed description of the features and their formation is omitted for brevity. However, as illustrated by FIG. 3A, dies 10 (including RDLs 18 and connectors 24) may be detached from a carrier (e.g., carrier 14) without the bonding on dies 32. Furthermore, connectors 24 may not be formed over RDLs 18. Instead, the structure illustrated in FIG. 2A includes connectors 26 on RDLs 18 may be of substantially the same size. For example, connectors 26 may be C4 bumps.

FIG. 3B illustrates the singulation of dies 10 (e.g., along scribe lines using a suitable pick and place tool) and the attachment of dies 10 to package substrate 30 through connectors 26. Notably, die 10 may be bonded to package substrate 30 prior to the attachment of dies 32 to package 300.

The configuration of package substrate 30 in package 300 may be altered from the configuration in package 100. For example, cavity 36 may be disposed on an opposing side (rather than a same side) of package substrate 30. In package 300, die 10 may be bonded to a surface 30A of package substrate 30. Surface 30A may be substantially level. Package substrate 30 may further include surface 30B (e.g., in cavity 36) and surface 30C opposing die 10. Due to the inclusion of cavity 36, surfaces 30B and 30C may not be substantially level. For example, in the orientation illustrated by FIG. 3B, surface 30B may be higher than surface 30C.

The formation of package substrate 30 having cavity 36 may include the patterning of core 37, build-up layer 39B (e.g., disposed on an opposing side of core 37 as die 10), and/or build-up layer 39A (e.g., disposed on a same side of core 37 as die 10). In various embodiments, cavity 36 may not extend through package substrate 30.

FIG. 3C illustrates the formation of various other features of package 300. For example, a reflow may be performed on connectors 26 and underfill 46 may be dispensed around connectors 26. Connectors 44 may be attached to surface 30C of package substrate 30 opposite die 10. Furthermore, a heat dissipation feature 40 may be disposed over die 10/molding compound 16. An interfacing material 42 (e.g., including a TIM and/or adhesive material) may be disposed between heat dissipation feature 40 and die 10/molding compound 16.

Figure 3D:
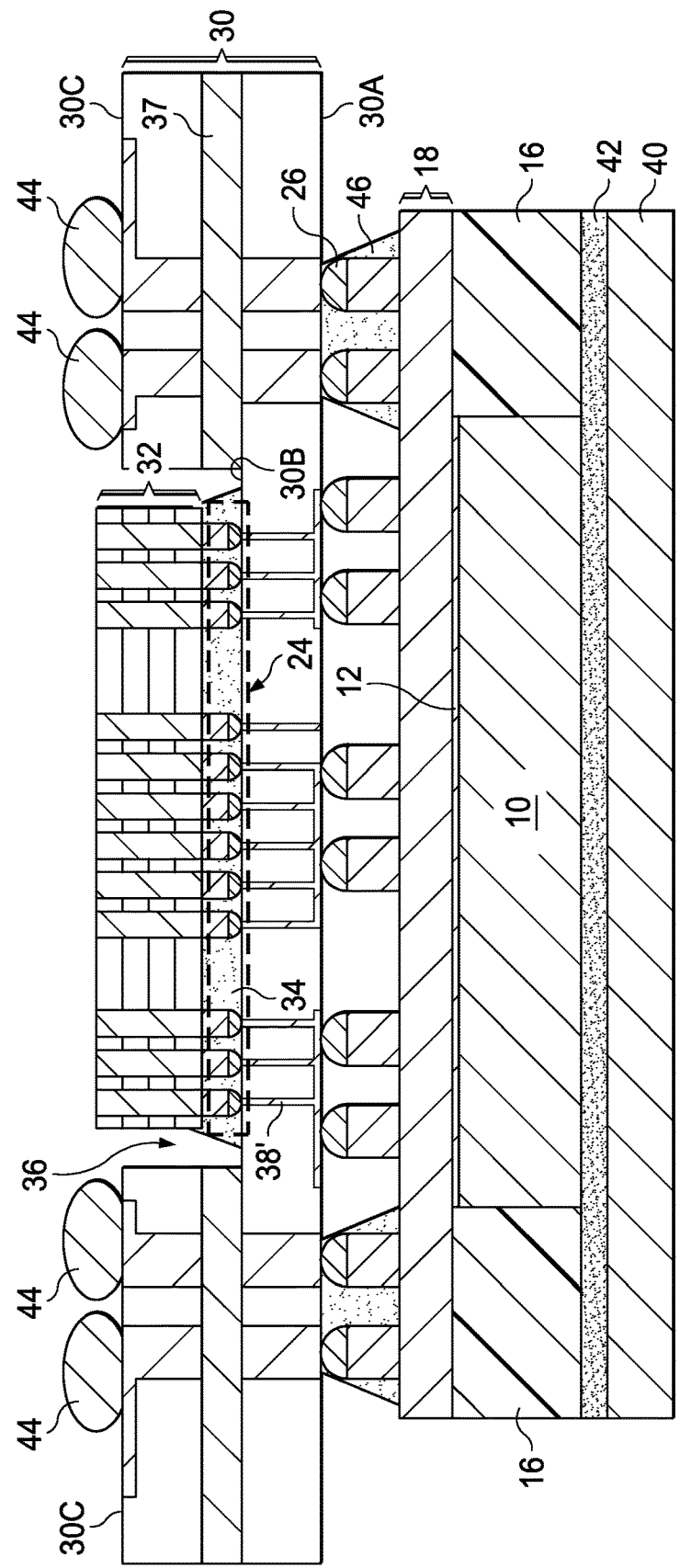
Figure 3E:
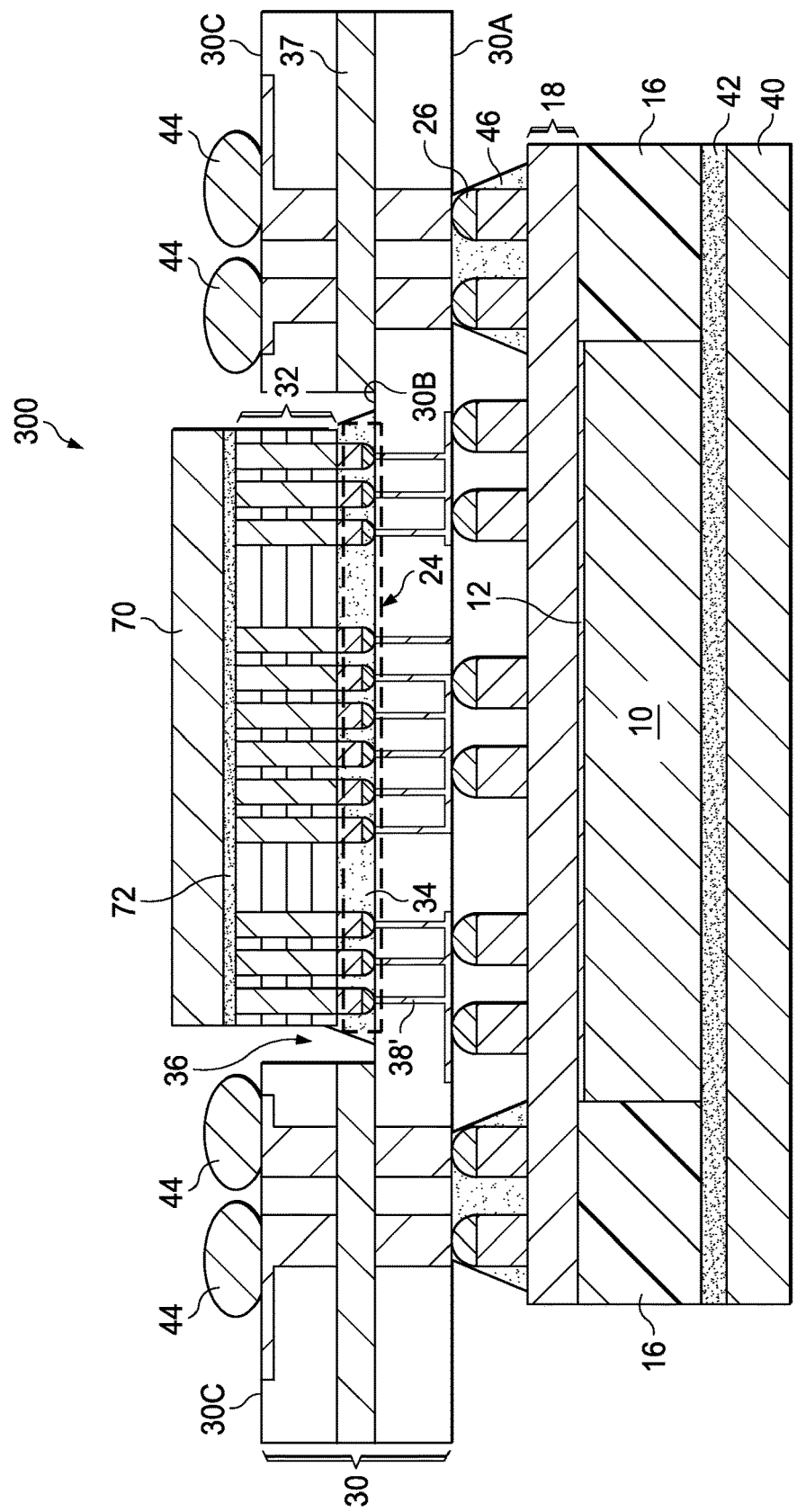

Subsequently, functional tests may be performed on package 300 prior to the attachment of dies 32. For example, electrical connections between die 10 and package substrate 30 may be tested. If package 300 passes the tests, dies 32 may be attached to package 300, for example, using connectors 24 formed as illustrated by FIG. 3D. Connectors 24 may be formed on dies 32 using any suitable method prior to attaching dies 32 to package 300. By performing functional tests on package 300 prior to the attachment of dies 32, dies 32 may be attached to only to known good packages. Packages that fail the functional tests may not have dies 32 attached thereto. Thus, cost savings may be incurred by avoiding attachment of dies 32 to failed packages.

Connectors 24 (e.g., microbumps) may be formed on dies 32 using any suitable method. Connectors 24 may be of a different size than connectors 26, and connectors 24 may be attached to contact pads on package substrate 30. Connectors 24 may be electrically connect dies 32 to die 10 through interconnect structures 38 in package substrate 30 (e.g., interconnect structures 38'), connectors 26, and RDLs 18.

Dies 32 may be disposed in cavity 36 of package substrate. In package 300, dies 32 and die 10 may be disposed on opposing sides of package substrate 30. Attaching dies 32 may include flipping package 300 (e.g., so that connectors 24 face upwards) and aligning dies 32 in cavity 36. A reflow may be performed on connectors 24 (e.g., to electrically connect dies 32 to die 10/package substrate 30), an underfill 34 may be dispensed around connectors 24.

The configuration of package 300 allows for a heat dissipation feature (e.g., heat dissipation feature 70) to be disposed on a surface dies 32. An interfacing material 72 may be disposed between heat dissipation feature 70 and dies 32, and interfacing material 72 may be in physical contact with dies 32. Heat dissipation feature 70 and interfacing material 72 may be substantially similar to heat dissipation feature 40 and interfacing material 42, respectively. Thus, an alternative manufacturing process may be used to form package 300.

Figure 5A:
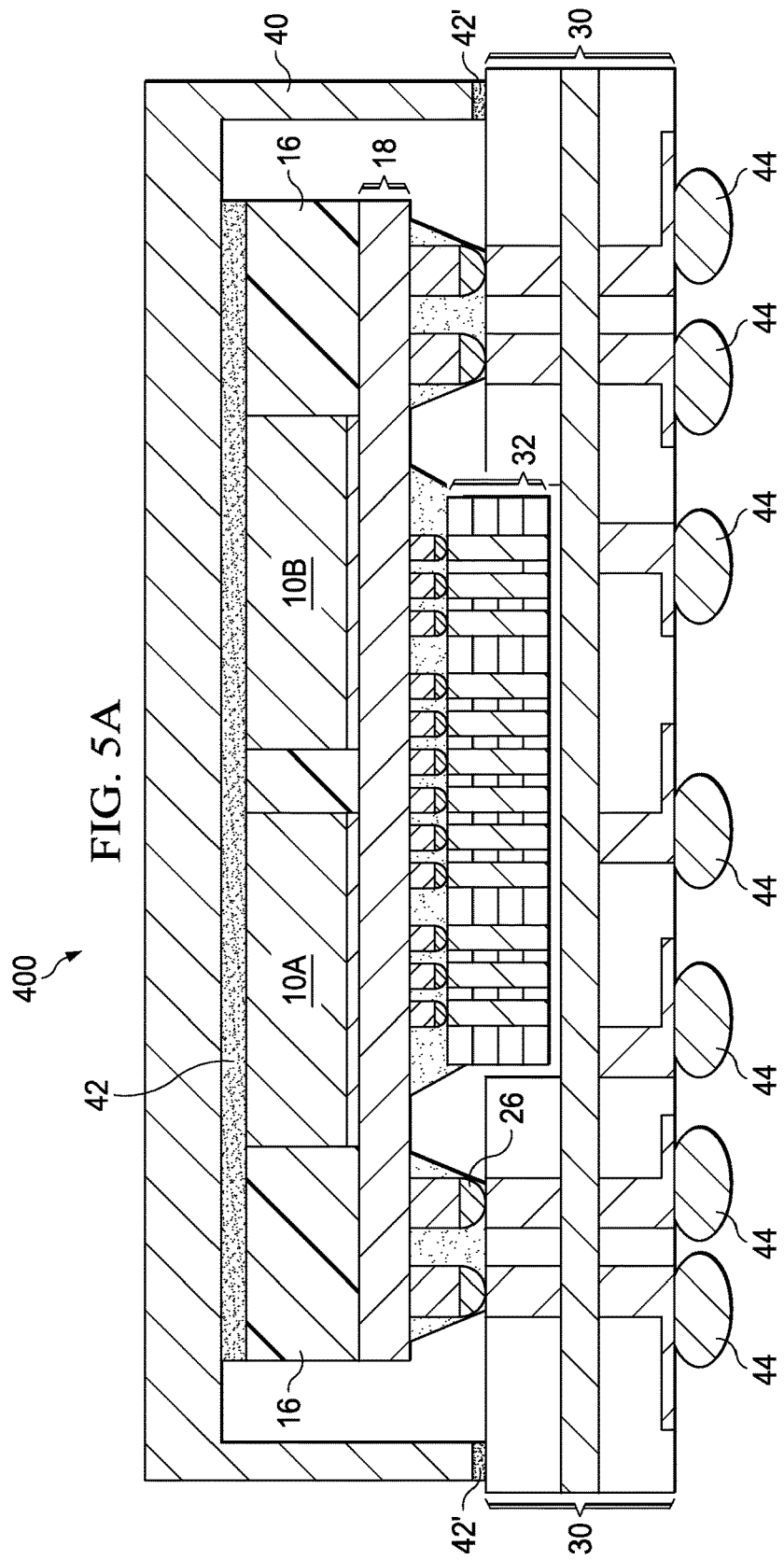
FIGS. 5A and 5B illustrate cross-sectional views of semiconductor packages in accordance with some alternative embodiments.
Figure 5B:
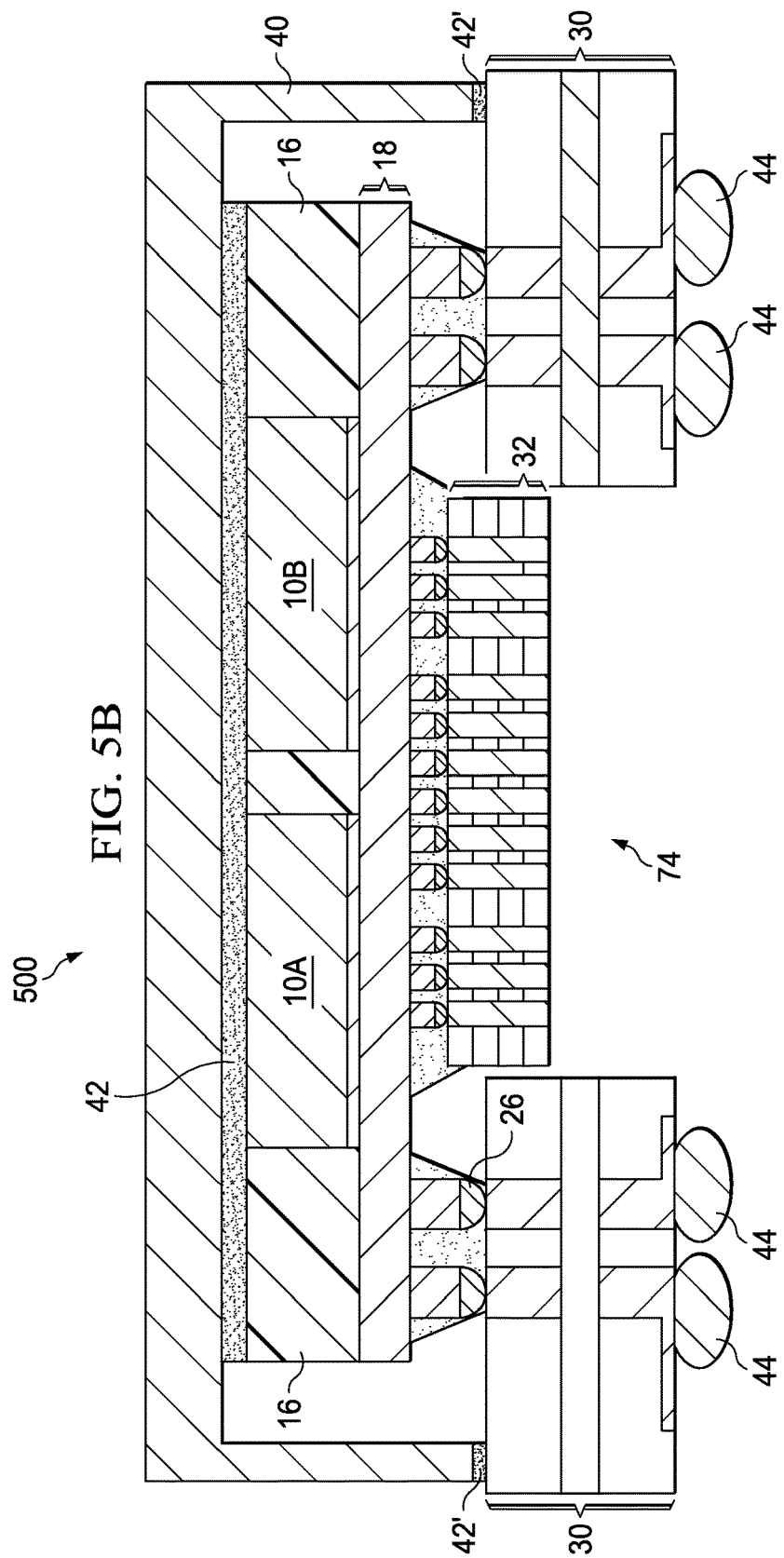

FIGS. 5A and 5B illustrate cross-sectional views of semiconductor packages 400 and 500, respectively. Packages 400 and 500 may be substantially similar to package 100 where like reference numerals represent like elements. However, packages 400 and 500 may further include multiple dies 10 (labeled 10A and 10B). Dies 10A and 10B may be part of a same fan-out package. For example, dies 10A and 10B may be surrounded by molding compound 14, and RDLs 18 may be formed on a surface of dies 10A and 10B. RDLs 18 may electrically connect dies 10A and 10B to dies 32. Furthermore, dies 10A and 10B may be substantially level. The formation of dies 10A and 10B may be substantially similar to the process illustrated in FIGS. 1A through 1J although singulation may be performed at different locations (e.g., scribe lines for a pick and place tool may be configured at different locations). In some embodiments, die 32 may be disposed in a cavity formed in substrate 30 (as illustrated by FIG. 5A). In other embodiments, die 32 may be disposed in a through-hole 74 in substrate 30 (as illustrated by FIG. 5B). Through hole 74 may be formed in substrate 30, for example, using a laser drilling process.

Thus, as described above, a package substrate may include a cavity. A first die may be bonded to the package substrate. Where the cavity may be on the same side of the package substrate as the first die or on an opposing side of the package substrate as the first die. One or more second dies may be bonded to the package substrate and the first die, and the second dies may be disposed in the cavity. The second die may be bonded directly to the first die, or the second die may be bonded directly to the package substrate. Thus, the configuration of the package substrate allows for a package having a relatively thin form factor. Furthermore, the configuration of the dies in the package may allow for relatively simplistic heat dissipation elements to be attached to at least the first die.

In accordance with an embodiment, a device includes a first die, a second die, one or more redistribution layers (RDLs) electrically connected to the first die, a plurality of connectors on a surface of the one or more RDLs, and a package substrate electrically connected to the first die and the second die. The package substrate is electrically connected to the first die through the one or more RDLs and the plurality of connectors. The package substrate comprises a cavity, and the second die is at least partially disposed in the cavity.

In accordance with another embodiment, a device includes first die, one or more redistribution layers (RDLs) on the first die, a first plurality of connectors on a surface of the one or more RDLs, a plurality of second dies, and a package substrate electrically connected to the first die and the plurality of second dies. The package substrate is electrically connected to the first die through the one or more RDLs and the plurality of connectors. The package substrate includes a core, one or more first build-up layers on a first side of the core, and one or more second build-up layers on a second side of the core opposite the first side. The one or more second build-up layers is patterned to form a cavity in the package substrate, and the plurality of second dies is at least partially disposed in the cavity.

In accordance with yet another embodiment, a method includes forming one or more redistribution layers (RDLs) on a first side of a first die, forming first connectors on the one or more redistribution layers, and bonding a package substrate to the first die using the first connectors. The package substrate is electrically connected to the first die through the one or more RDLs, and the package substrate includes a cavity. The method further includes electrically connecting a second die to the package substrate. The second die is at least partially disposed in the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first die;
   one or more redistribution layers (RDLs) electrically connected to the first die;
   a first plurality of connectors on a surface of the one or more RDLs, the one or more RDLs being interposed between the first plurality of connectors and the first die;
   a second die;
   a package substrate electrically connected to the first die and the second die, wherein the package substrate comprises:
      a metal-clad insulated base material core, the metal-clad insulated base material core having an uppermost surface and a lower-most surface, wherein the lower-most surface is closer to the one or more RDLs than the upper-most surface; and
      a cavity extending through the metal-clad insulated base material core, wherein the second die is at least partially disposed in the cavity, and wherein the first die is electrically connected to the package substrate through the first plurality of connectors and the one or more RDLs; and
   a second plurality of connectors in the cavity, the second plurality of connectors bonding the second die to the package substrate, the second plurality of connectors extending toward a bottommost surface of the cavity below the upper-most surface of the metal-clad insulated base material core, the second plurality of connectors directly contacting the package substrate along the bottommost surface of the cavity.

2. The device of claim 1, wherein the first die and the second die are disposed on opposing sides of the package substrate.

3. The device of claim 2, further comprising a first heat dissipation feature on a surface of the second die.

4. The device of claim 3, wherein the package substrate comprises one or more interconnect structures electrically connecting the first die to the second die.

5. The device of claim 1, further comprising a second heat dissipation feature on a surface of the first die.

6. The device of claim 1, wherein the cavity does not extend completely through the package substrate.

7. The device of claim 1, wherein the package substrate further comprises:
first build-up layers, wherein the cavity extends through the first build-up layers; and
second build-up layers on an opposing side of the metal-clad insulated base material core as the first build-up layers, wherein the cavity exposes the second build-up layers.

8. The device of claim 1, further comprising a molding compound encapsulating the first die, the molding compound extending along a sidewall of the first die.

9. A device comprising:
a first die;
one or more redistribution layers (RDLs) on the first die;
a first plurality of connectors on a surface of the one or more RDLs, the one or more RDLs being interposed between the first plurality of connectors and the first die;
a second die;
a package substrate electrically connected to the first die and the second die, wherein the package substrate is electrically connected to the first die through the one or more RDLs and the first plurality of connectors, and wherein the package substrate comprises:
a core;
one or more first build-up layers on a first side of the core; and
one or more second build-up layers on a second side of the core opposite the first side, wherein the one or more second build-up layers and the core are patterned to form a cavity in the package substrate, wherein the second die is at least partially disposed in the cavity, wherein the cavity exposes a surface of the one or more first build-up layers substantially level with a surface of the core, and wherein an upper-most surface and a lower-most surface of material forming the core are interposed between the one or more first build-up layers and the one or more second build-up layers; and
a second plurality of connectors in the cavity, the second die being bonded to the package substrate through the second plurality of connectors, portions of the second plurality of connectors extending between an upper-most surface of the core and a lower-most surface of the core, the upper-most surface of the core being opposite the lower-most surface of the core, the lower-most surface of the core facing the one or more RDLs.

10. The device of claim 9, wherein the cavity is disposed on an opposing side of the package substrate as the first die.

11. The device of claim 9, wherein at least one of the one or more first build-up layers is disposed between the first die and the second die.

12. The device of claim 9, wherein the core comprises a metal-clad insulated base material.

13. The device of claim 9, further comprising a heat dissipation feature on a surface of the second die.

14. The device of claim 9, further comprising a heat dissipation feature on a surface of the first die.

15. The device of claim 14, further comprising a molding compound encapsulating the first die, at least a portion of the molding compound being interposed between the heat dissipation feature and the one or more RDLs.

16. A method comprising:
forming one or more redistribution layers (RDLs) on a first side of a first die;
forming first connectors on the one or more RDLs, the one or more RDLs being interposed between the first connectors and the first die;
forming a cavity extending at least partially through a package substrate, wherein the package substrate comprises:
one or more first build-up layers on a first side of a metal-clad insulated base material core; and
one or more second build-up layers on an opposing second side of the metal-clad insulated base material core, wherein forming the cavity comprises patterning the cavity through the one or more first build-up layers and the metal-clad insulated base material core to expose a surface of the one or more second build-up layers, and wherein a top surface and a bottom surface of material forming the metal-clad insulated base material core are interposed between the one or more first build-up layers and the one or more second build-up layers;
bonding the package substrate to the first die using the first connectors, wherein the package substrate is electrically connected to the first die through the one or more RDLs; and
electrically connecting a second die to the package substrate, wherein the second die is at least partially disposed in the cavity, wherein electrically connecting the second die comprises forming second connectors on the second die and bonding the second die to a surface of the package substrate in the cavity using the second connectors, and wherein a sidewall of at least one of the second connectors faces a sidewall of a portion of the cavity disposed within the metal-clad insulated base material core.

17. The method of claim 16 further comprising attaching a heat dissipation feature to a surface of the first die.

18. The method of claim 17 further comprising attaching a heat dissipation feature to a surface of the second die.

19. The method of claim 16, further comprising forming a molding compound along a sidewall of the first die.

20. The method of claim 19, wherein one or more RDLs extend along an upper-most surface of the molding compound.

* * * * *